(12) United States Patent
Kawashima

(10) Patent No.: US 7,193,354 B2
(45) Date of Patent: Mar. 20, 2007

(54) RESONATOR, UNIT HAVING RESONATOR, OSCILLATOR HAVING UNIT AND ELECTRONIC APPARATUS HAVING OSCILLATOR

(75) Inventor: Hirofumi Kawashima, Tokyo (JP)

(73) Assignee: Piedek Technical Laboratory (JP)

( * ) Notice: Subject to any disclaimer, the term of this patent is extended or adjusted under 35 U.S.C. 154(b) by 153 days.

(21) Appl. No.: 10/875,114

(22) Filed: Jun. 23, 2004

(65) Prior Publication Data

US 2004/0263027 A1   Dec. 30, 2004

(30) Foreign Application Priority Data

Jun. 30, 2003 (JP) ............... 2003-205844
Dec. 5, 2003 (JP) ............... 2003-436310

(51) Int. Cl.
*H03H 9/21* (2006.01)
*H03B 5/36* (2006.01)
*H03B 5/32* (2006.01)

(52) U.S. Cl. ............... 310/370; 310/366; 333/200; 333/186; 333/187; 331/107 A; 331/156

(58) Field of Classification Search ......... 310/370, 310/366, 348, 368, 344, 361; 333/186, 200, 333/187; 331/156, 107 A
See application file for complete search history.

(56) References Cited

U.S. PATENT DOCUMENTS

| 4,265,841 | A | * | 5/1981 | Fujimori et al. | ............ 264/430 |
| 4,384,232 | A | * | 5/1983 | Debely | ............ 310/370 |
| 5,285,127 | A | * | 2/1994 | Egley et al. | ............ 310/366 |
| 5,334,900 | A | * | 8/1994 | Kawashima | ............ 310/370 |
| 6,587,009 | B2 | * | 7/2003 | Kitamura et al. | ............ 310/370 |
| 6,707,234 | B1 | * | 3/2004 | Kawashima | ............ 310/367 |
| 6,717,336 | B2 | * | 4/2004 | Kawashima | ............ 310/367 |

\* cited by examiner

*Primary Examiner*—Darren Schuberg
*Assistant Examiner*—Karen Beth Addison
(74) *Attorney, Agent, or Firm*—Adams & Wilks

(57) ABSTRACT

An electronic apparatus comprises a display portion and a plurality of oscillators, one of which is a quartz crystal oscillator comprising: a quartz crystal oscillating circuit comprising; an amplification circuit and a feedback circuit. For example, the feedback circuit is constructed by a quartz crystal resonator comprising vibrational arms and a base portion, and having novel shape and electrode construction. Also, the quartz crystal resonator is housed in a package. In addition, from a relationship of an amplification rate of the amplification circuit and a feedback rate of the feedback circuit, an output signal of the quartz crystal oscillating circuit having an oscillation frequency of a fundamental mode of vibration for the quartz crystal resonator can be provided with a frequency of high stability.

39 Claims, 23 Drawing Sheets

FIG. 13
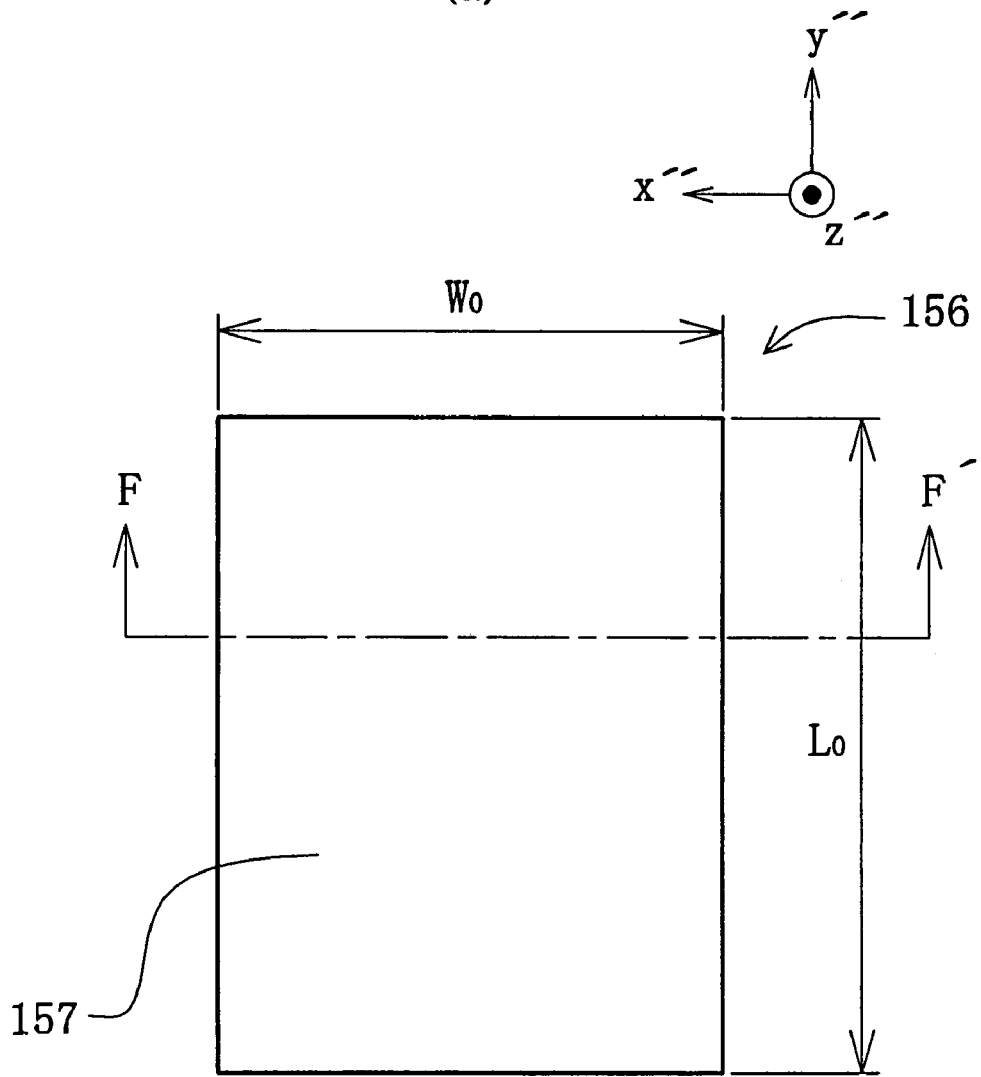
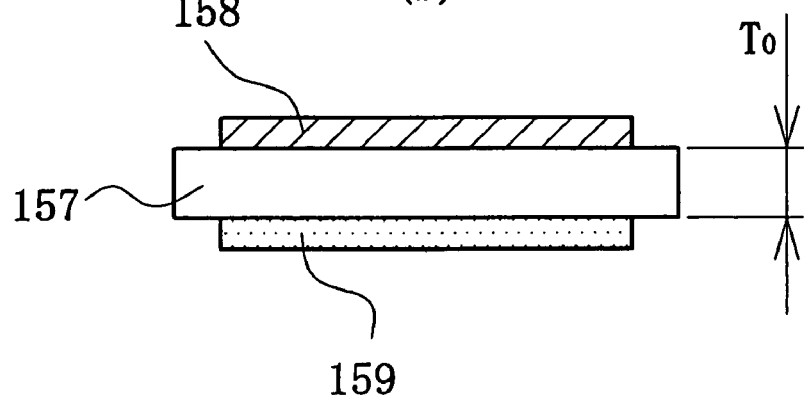

FIG. 15
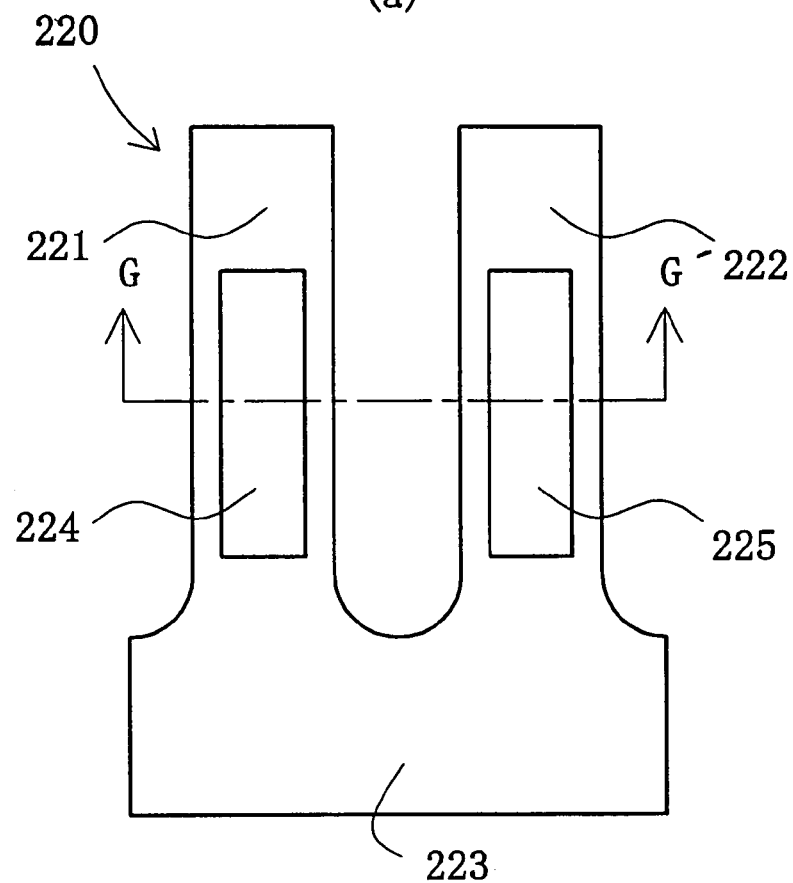
(a)
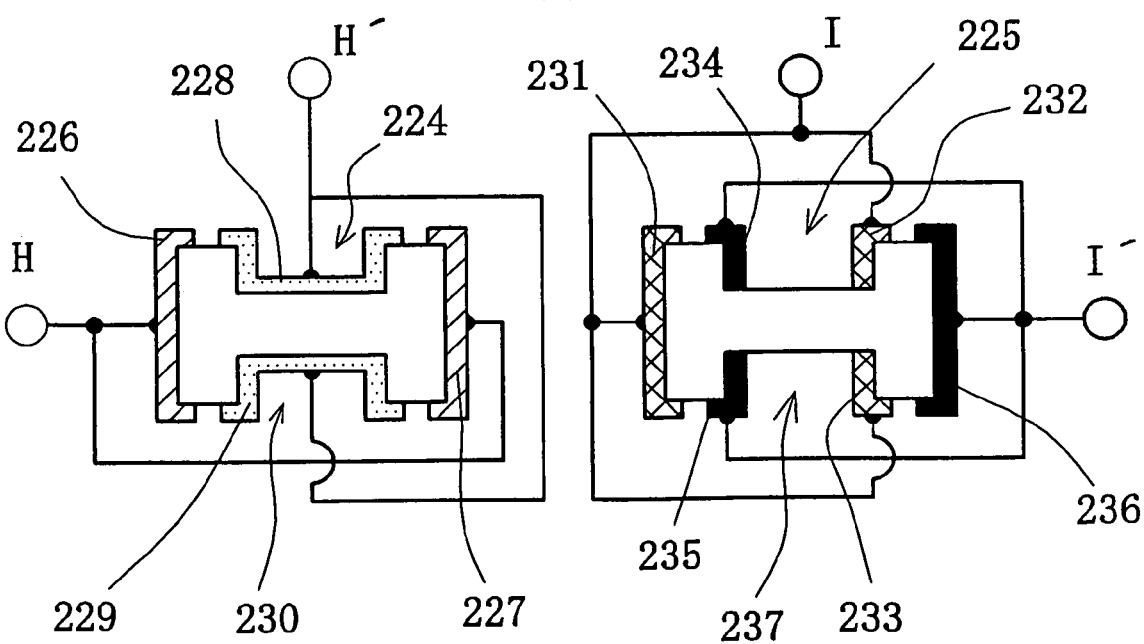
(b)

FIG. 16
(a)
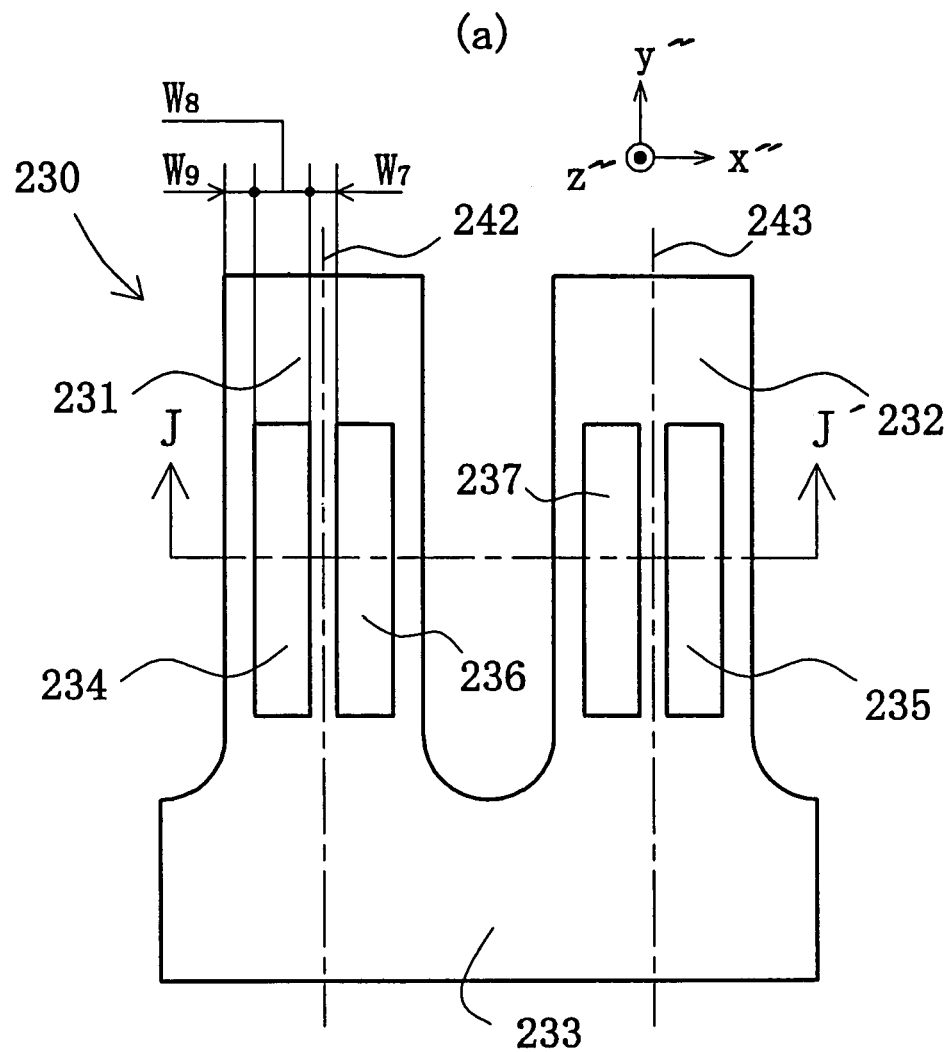
(b)
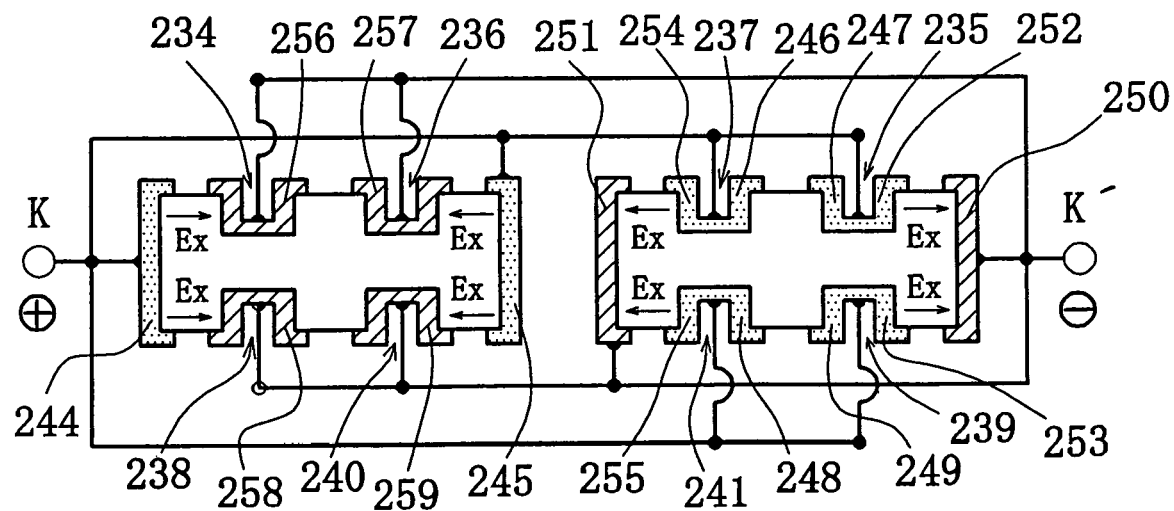

RESONATOR, UNIT HAVING RESONATOR, OSCILLATOR HAVING UNIT AND ELECTRONIC APPARATUS HAVING OSCILLATOR

FIELD OF THE INVENTION

The present invention relates to a resonator, a unit having the resonator, an oscillator having the unit and an electronic apparatus having the oscillator.

BACKGROUND OF THE INVENTION

There are many electronic apparatus comprising a display portion and a quartz crystal oscillator at least. For example, cellular phones, wristwatches, facsimiles, digital cameras and DVD recorders comprising a quartz crystal oscillator are well known. Recently, because of high stability for frequency, miniaturization and the light weight nature of these electronic apparatus, the need for an electronic apparatus comprising a smaller quartz crystal oscillator with a frequency of high stability has arisen. For example, the quartz crystal oscillator having a quartz crystal tuning fork resonator housed in a unit, which vibrates in a flexural mode, is widely used as a time standard in an electronic apparatus such as the cellular phones, the wristwatches, the facsimiles, the digital cameras and the DVD recorders.

Similar to this, the same need has also arisen for an electronic apparatus comprising a contour mode resonator such as a length-extensional mode quartz crystal resonator, a width-extensional mode quartz crystal resonator and a Lame mode quartz crystal resonator or a thickness shear mode quartz crystal resonator or a SAW (Surface Acoustic Wave) resonator or a resonator for sensing angular velocity made of a piezoelectric material such as quartz crystal, lithium tantalite ($LiTaO_3$), lithium niobate ($LiNbO_3$) and ceramics.

Heretofore, however, it has been impossible to obtain an electronic apparatus comprising a smaller quartz crystal oscillator with a miniature quartz crystal tuning fork resonator of the prior art, capable of vibrating in a flexural mode, and having a frequency of high stability, a small series resistance and a high quality factor. This is the reason why, when miniaturized, the quartz crystal tuning fork resonator of the prior art, capable of vibrating in a flexural mode has a smaller electromechanical transformation efficiency. As a result, the resonator has a frequency of low stability, a large series resistance and a reduced quality factor.

Additionally, there has been a big problem in the quartz crystal oscillator of the prior art having the quartz crystal tuning fork resonator of the prior art, such that a frequency of a fundamental mode of vibration of the tuning fork resonator which is an output signal of the oscillator jumps to a second overtone mode of vibration thereof by shock or vibration.

Similarly, however, it has been impossible to obtain an electronic apparatus comprising a smaller quartz crystal oscillator with a contour mode resonator such as a length-extensional mode quartz crystal resonator, a width-extensional mode quartz crystal resonator and a Lame mode quartz crystal resonator or a thickness shear mode quartz crystal resonator or a SAW resonator or a resonator for sensing angular velocity having a frequency of high stability, a small series resistance and a high quality factor because, when miniaturized, each resonator has a small electromechanical transformation efficiency, as a result, a frequency of low stability, a large series resistance and a low quality factor, and also is not strong against shock.

It is, therefore, a general object of the present invention to provide embodiments of a quartz crystal resonator, a quartz crystal unit, a quartz crystal oscillator and an electronic apparatus of the present invention, which overcome or at least mitigate one or more of the above problems.

SUMMARY OF THE INVENTION

The present invention relates to a resonator, a unit, an oscillator and an electronic apparatus comprising a display portion and a plurality of oscillators, one of which comprises a quartz crystal oscillator comprising a quartz crystal oscillating circuit having an amplification circuit and a feedback circuit, and in particular, relates to a quartz crystal resonator capable of vibrating in a flexural mode, a quartz crystal unit having the quartz crystal resonator and a quartz crystal oscillator having the quartz crystal unit and having an output signal of a frequency of high stability for a fundamental mode of vibration of the quartz crystal resonator, and also to a quartz crystal oscillator having a suppressed second overtone mode of vibration of the quartz crystal resonator, in addition, relates to a quartz crystal oscillator comprising an another contour mode resonator such as a length-extensional mode resonator, a width-extensional mode resonator and a Lame mode resonator or a thickness shear mode resonator, each made of quartz crystal or a SAW resonator or a piezoelectric resonator for sensing angular velocity. The quartz crystal oscillator is, therefore, available for the electronic apparatus requiring a miniature quartz crystal oscillator with high time accuracy and shock proof.

It is an object of the present invention to provide a miniature quartz crystal resonator, capable of vibrating in a flexural mode, and having a high electromechanical transformation efficiency.

It is an another object of the present invention to provide a miniature quartz crystal unit with a quartz crystal resonator, capable of vibrating in a fundamental mode of vibration of a flexural mode, and having a high electromechanical transformation efficiency.

It is a further object of the present invention to provide a quartz crystal oscillator with a miniature quartz crystal resonator, capable of vibrating in a flexural mode, and having a frequency of high stability, a small series resistance $R_1$ and a high quality factor $Q_1$, whose nominal frequency for a fundamental mode of vibration is within a range of 10 kHz to 200 kHz. Especially, a frequency of about 32.768 kHz is very available for a time standard of a frequency signal.

It is a still another object of the present invention to provide an electronic apparatus comprising a display portion and a plurality of oscillators.

According to one aspect of the present invention, there is provided a quartz crystal resonator comprising: a plurality of vibrational arms, each of the vibrational arms having a first main surface and a second main surface and side surfaces; and a base portion to which the vibrational arms are attached, in which the resonator has a piezoelectric constant $e'_{12}$ in the range of 0.1 C/m² to 0.19 C/m² in the absolute value.

According to a second aspect of the present invention, there is provided a quartz crystal unit comprising: a quartz crystal resonator having a base portion and a plurality of vibrational arms attached to the base portion; a case for housing the quartz crystal resonator; and a lid for covering an open end of the case, each of the vibrational arms having a first main surface and a second main surface opposite the first main surface and side surfaces, in which the quartz crystal resonator has a cutting angle in the range of ZYlwt (−20° to +20°)/(−25° to +25°)/(−18° to +18°) and a piezoelectric constant $e'_{12}$ of the resonator is within a range of 0.1 $C/m^2$ to 0.19 $C/m^2$ in the absolute value.

According to a third aspect of the present invention, there is provided a quartz crystal oscillator comprising: a quartz crystal oscillating circuit comprising; an amplification circuit comprising a CMOS inverter and a feedback resistor, and a feedback circuit comprising a quartz crystal resonator capable of vibrating in a flexural mode, a plurality of capacitors and a drain resistor, the quartz crystal resonator being housed in a package comprising a case for housing the quartz crystal resonator and a lid for covering an open end of the case, and comprising: a plurality of vibrational arms, each of the vibrational arms having a first main surface and a second main surface opposite the first main surface and side surfaces; and a base portion to which the vibrational arms are attached, in which the quartz crystal resonator has a cutting angle in the range of ZYlwt (−20° to +20°)/(−25° to +25°)/(−18° to +18°) and a piezoelectric constant $e'_{12}$ of the resonator is within a range of 0.1 $C/m^2$ to 0.19 $C/m^2$ in the absolute value.

According to a fourth aspect of the present invention, there is provided an electronic apparatus comprising a display portion and a plurality of oscillators, one of the oscillators being a quartz crystal oscillator comprising: a quartz crystal oscillating circuit comprising; an amplification circuit having a CMOS inverter and a feedback resistor, and a feedback circuit having a quartz crystal tuning fork resonator capable of vibrating in a flexural mode of an inverse phase, a plurality of capacitors and a drain resistor, the quartz crystal tuning fork resonator comprising a tuning fork base and a plurality of tuning fork arms connected to the tuning fork base, each of the tuning fork arms having a first main surface and a second main surface opposite the first main surface and side surfaces, the quartz crystal tuning fork resonator being housed in a package comprising a case for housing the resonator and a lid for covering an open end of the case, in which the quartz crystal tuning fork resonator has a fundamental mode of vibration and a second overtone mode of vibration and the amplification circuit of the quartz crystal oscillating circuit has negative resistances $-RL_1$ and $-RL_2$ for the fundamental mode of vibration and the second overtone mode of vibration of the quartz crystal tuning fork resonator, in which an absolute value of the negative resistances is defined by $|-RL_1|$ and $|-RL_2|$ and a ratio of the $|-RL_1|$ and $R_1$ is greater than that of the $|-RL_2|$ and $R_2$, where $R_1$ and $R_2$ represent a series resistance of the fundamental mode of vibration and the second overtone mode of vibration of the quartz crystal resonator, respectively, in which an output signal of the quartz crystal oscillating circuit has an oscillation frequency of the fundamental mode of vibration of the quartz crystal tuning fork resonator and is a clock signal which is used to display time at a display portion of the electronic apparatus, and in which the quartz crystal tuning fork resonator has a cutting angle in the range of ZYlwt (−20° to +20°)/(−25° to +25°)/(−18° to +18°) and a piezoelectric constant $e'_{12}$ of the resonator is within a range of 0.1 $C/m^2$ to 0.19 $C/m^2$ in the absolute value.

Preferably, the piezoelectric constant $e'_{12}$ is within a range of 0.12 $C/m^2$ to 0.19 $C/m^2$ in the absolute value.

Preferably, mounting arms protruding from the base portion comprise two.

Preferably, each of the vibrational arms has a groove having a first stepped portion and a second stepped portion.

Preferably, each of the vibrational arms has a through groove.

Preferably, a merit value $M_2$ of a second overtone mode of vibration of the quartz crystal resonator having vibrational arms and a base portion is less than 30.

Preferably, the quartz crystal oscillator with the quartz crystal resonator is constructed so that a ratio of an amplification rate $\alpha_1$ of the fundamental mode vibration and an amplification rate $\alpha_2$ of the second overtone mode vibration of the amplification circuit is greater than that of a feedback rate $\beta_2$ of the second overtone mode vibration and a feedback rate $\beta_1$ of the fundamental mode vibration of the feedback circuit, and a product of the amplification rate $\alpha_1$ and the feedback rate $\beta_1$ of the fundamental mode vibration is greater than 1.

The present invention will be more fully understood by referring to the following detailed specification and claims taken in connection with the appended drawings.

BRIEF DESCRIPTION OF THE DRAWINGS

FIG. 13(a) and FIG. 13(b) show a plan view of a thickness shear mode quartz crystal resonator constructing an electronic apparatus of the present invention and a F–F' sectional view of the resonator;

FIG. 15(a) and FIG. 15(b) show a plan view of a resonator for sensing angular velocity constructing an electronic apparatus of the present invention and a G–G' sectional view of the resonator;

FIG. 16(a) and FIG. 16(b) show a plan view of a quartz crystal resonator of an eighth embodiment of the present invention and comprising a quartz crystal tuning fork resonator, and a J–J' sectional view of the resonator;

DETAILED DESCRIPTION OF THE PREFERRED EMBODIMENTS

Figure 1:
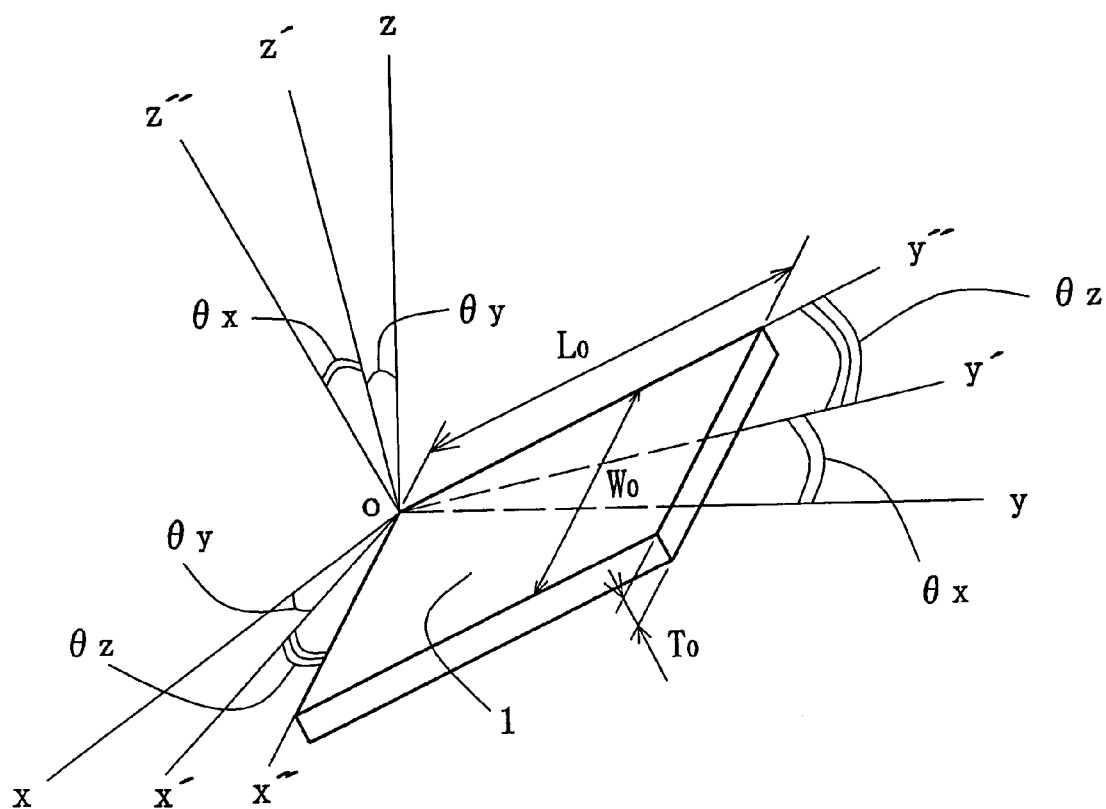
FIG. 1 is a general view of a quartz crystal plate from which a quartz crystal resonator of the present invention is formed.

Referring now to the drawings, the embodiments of the present invention will be described in more detail.

FIG. 1 is a general view of a quartz crystal plate 1 from which a quartz crystal resonator of the present invention is formed, and particularly, a relationship of cutting angles $\theta_x$, $\theta_y$ and $\theta_z$ of the quartz crystal plate 1 and its coordinate system is illustrated in FIG. 1. The coordinate system has original point o, electrical axis x, mechanical axis y and optical axis z of quartz crystal and o-xyz is constructed.

First, a quartz crystal plate perpendicular to z axis, so called, Z plate quartz crystal is taken. The Z plate quartz crystal has a dimension of Width $W_0$, length $L_0$ and thickness $T_0$ corresponding to a respective direction of x, y and z axes.

Next, this Z plate quartz crystal is, first, rotated with an angle $\theta_y$ about the y axis, second, rotated with an angle $\theta^x$ about x' axis which is a new axis of the x axis, and third, rotated with an angle $\theta_z$ about z" axis which is a new axis of the z axis, . In this case, each of the x, y and z axes changes to x", y" and z" axes, respectively, because each axis is rotated twice about two axes. A quartz crystal resonator of the present invention is, therefore, formed from the quartz crystal plate with the rotation angles.

In other words, according to an expression of IEEE notation, a cutting angle of the quartz crystal resonator of the present invention can be expressed by ZYlwt($\theta_y$)/($\theta_x$)/($\theta_z$), and each of the angles $\theta_y$, $\theta_x$, $\theta_z$ will be described later in detail according to resonators of the present invention.

Figure 2:
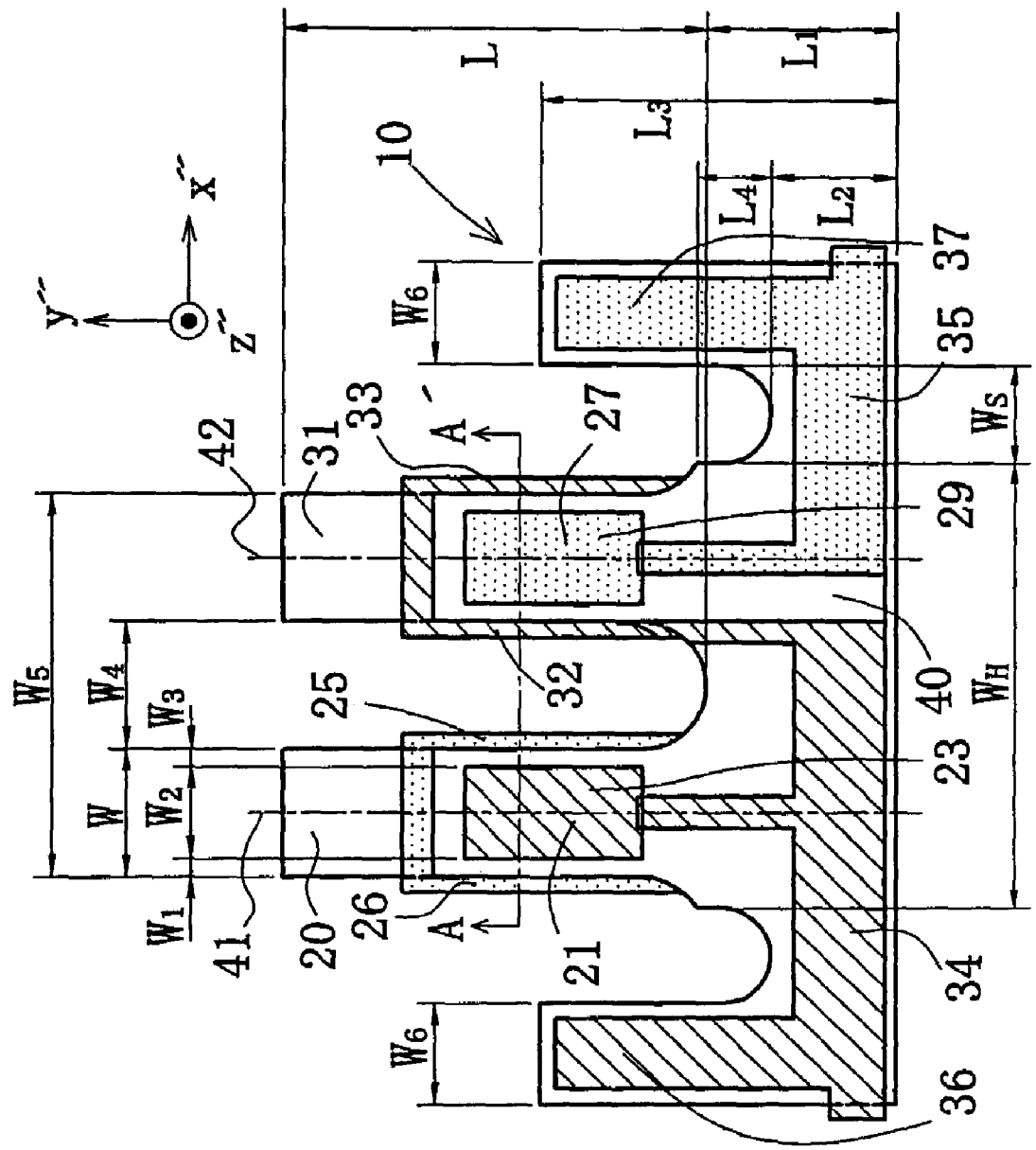
FIG. 2 shows a plan view of a quartz crystal resonator of a first embodiment of the present invention, and comprising a quartz crystal tuning fork resonator capable of vibrating in a flexural mode.

FIG. 2 shows a plan view of a quartz crystal resonator 10 of a first embodiment of the present invention and which is a quartz crystal tuning fork resonator. The resonator 10 comprises vibrational arms 20 and 31 and a base portion 40 attached to the vibrational arms, and the base portion 40 has mounting arms 36 and 37 protruding from the base portion, each of which is mounted on a mounting portion of a package comprising a case for housing the resonator and a lid for covering an open end of the case. In addition, each of the vibrational arms 20 and 31 has a first main surface and a second main surface opposite the first main surface and side surfaces, and the vibrational arms 20 and 31 have grooves 21 and 27, respectively, each of which has stepped portions comprising a first stepped portion and a second stepped portion. Also, the resonator 10 has cutting angles $\theta_y$, $\theta_x$ and $\theta_z$ which are within a range of −20° to +20°, −25° to +25° and −18° to +18°, respectively, namely, a cutting angle of the resonator is within a range of ZYlwt(−20° to +20°)/(−25° to +25°)/(−18° to +18°). In this embodiment, the quartz crystal tuning fork resonator can vibrate in a flexural mode of a fundamental mode of an inverse phase, and which is one of a contour mode quartz crystal resonator.

In more detail, the groove 21 is constructed to include a portion of a central linear line 41 of the arm 20, and the groove 27 is similarly constructed to include a portion of a central linear line 42 of the arm 31. Each of the grooves 21 and 27 has a width $W_2$, and the width $W_2$ including a portion of the central linear lines 41 and 42, is preferable because a large moment of inertia occurs at the arms 20 and 31 and the arms can vibrate in a flexural mode easily. As a result, the quartz crystal tuning fork resonator capable of vibrating in a fundamental mode can be obtained with a small series resistance $R_1$ and a high quality factor $Q_1$.

Figure 3:
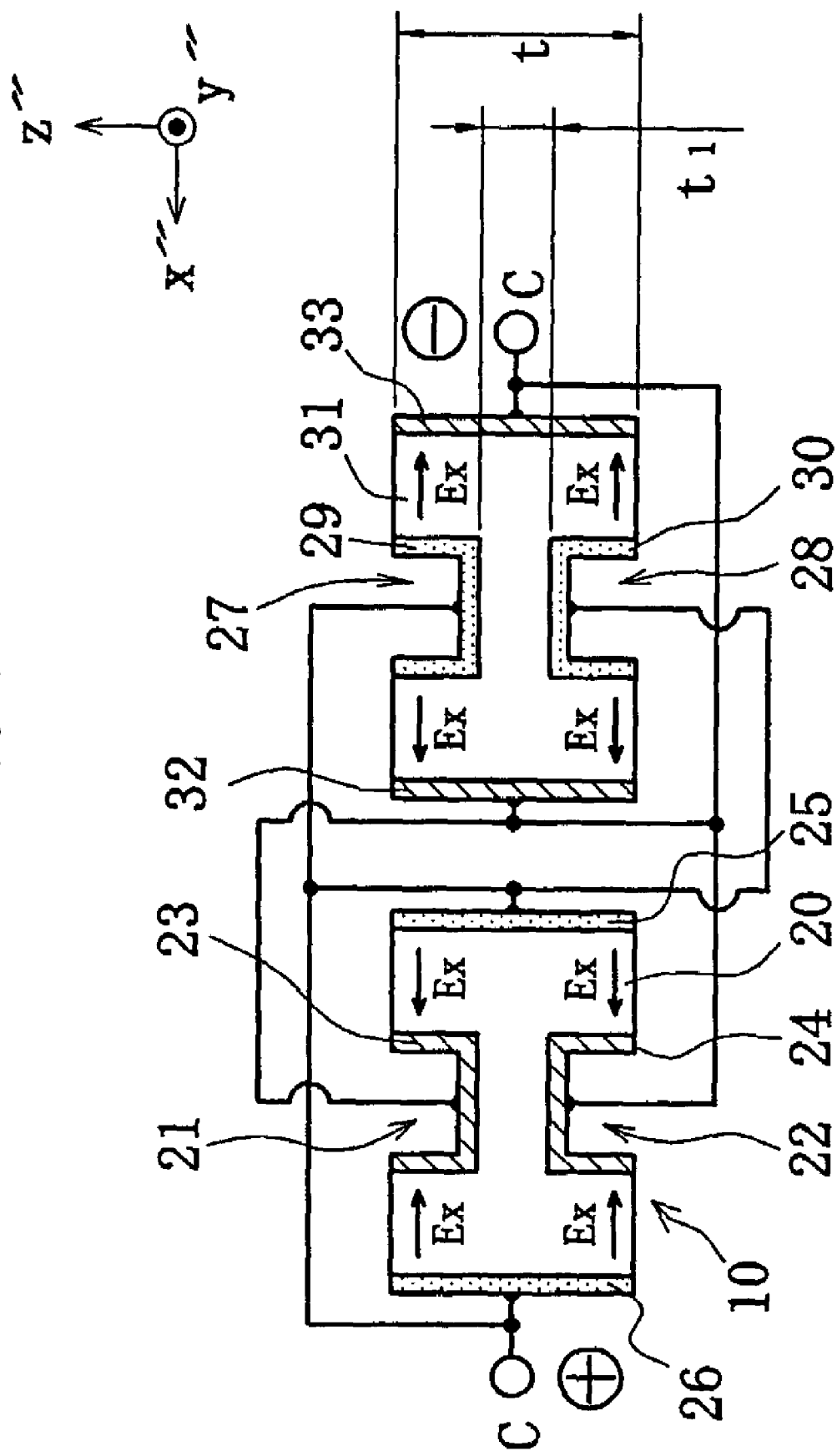
FIG. 3 shows an A–A' cross-sectional view of the vibrational arms of the quartz crystal resonator in FIG. 2.

In addition, when each of the vibrational arms 20 and 31 has part widths $W_1$ and $W_3$, an arm width W of the arms 20 and 31 has a relationship of $W=W_1+W_2+W_3$, and the part widths $W_1$ and $W_3$ are constructed so that $W_1 \geq W_3$ or $W_1 < W_3$. In addition, the width $W_2$ is constructed so that $W_2 \geq W_1$, $W_3$. In this embodiment, also, the grooves are constructed at the arms so that a ratio $W_2/W$ of the width $W_2$ and the arm width W is greater than 0.35 and less than 1, preferably, within a range of 0.35 to 0.95 and a ratio $t_1/t$ is less than 0.79, where $t_1$ and t are a thickness of the groove and the vibrational arms, as shown in FIG. 3, to obtain a very large moment of inertia of the vibrational arms. That is, the quartz crystal tuning fork resonator, capable of vibrating in the fundamental mode, and having a frequency of high stability can be provided with a small series resistance $R_1$, a high quality factor $Q_1$ and a small capacitance ratio $r_1$ because it has a very large electromechanical transformation efficiency.

Likewise, each of the vibrational arms 20 and 31 has a length L and each of the grooves 21 and 27 has a length $l_0$ (not shown here). In this embodiment, a ratio of the length $l_0$ and the length L is within a range of 0.3 to 0.8 to get a quartz crystal tuning fork resonator with series resistance $R_1$ of a fundamental mode of vibration smaller than series resistance $R_2$ of a second overtone mode of vibration. In other words, the length $l_0$ is within a range of 30% to 80% to the length L. In general, the length $l_0$ is within a range of 0.45 mm to 1.25 mm. Also, when a plurality of grooves are formed in at least one of upper and lower faces of the arms and divided into the length direction of the arms, the length $l_0$ is a total length of the grooves.

In addition, electrodes 25 and 26 are disposed on side surfaces of the vibrational arm 20 and an electrode 23 is disposed on a surface of the groove 21, which extends into the mounting arm 36 having a connecting portion 34. Similar to this, electrodes 32 and 33 are disposed on side surfaces of the vibrational arm 31 and an electrode 29 is disposed on a surface of the groove 27, which extends into the mounting arm 37 having a connecting portion 35. Each of the connecting portions 34 and 35 has a length $L_2$ and a width $W_S$, and each of the mounting arms has a length $L_3$ and a width $W_6$. Also, the electrode 23 is connected to the electrodes 32 and 33, and the electrode 29 is connected to the electrodes 25 and 26.

In this embodiment, the length 10 of the groove corresponds to a length $l_d$ of the electrode disposed inside each of the grooves, when the length $l_d$ of the electrode is less than the length $l_0$ of the groove, namely, the length $l_0$ is of the length $l_d$ of the electrode. In addition, the base portion 40 has a length $L_1$ and a width $W_H$, the length $L_1$ is less than 0.5 mm, preferably, within a range of 0.015 mm to 0.49 mm, and a total length $L_t$ (=L+$L_1$) in this embodiment is less than 2.1 mm, preferably, within a range of 1.02 mm to 1.95 mm to obtain a miniature quartz crystal resonator. Also, when a distance $W_4$ between the vibrational arms is taken, a total width $W_5$ (=2W+$W_4$) is less than 0.53 mm, preferably, within a range of 0.15 mm to 0.52 mm, and the width $W_5$ is equal to or less than the $W_H$ which is less than 0.55 mm, preferably, within a range of 0.15 mm to 0.53 mm.

In addition, the length $L_3$ is greater than or equal to the length $L_2$ and also, the length $L_1$ is greater than or equal to the length $L_2$ or the length $L_1$ is less than the length $L_2$. In actual, a value of $L_1$–$L_2$ is within a range of –0.1 mm to 0.32 mm, especially, when $W_H$ is greater than $W_5$, a distance $L_4$ between an edge of the connecting portion and an outer edge of the vibrational arm is within a range of 0.012 mm to 0.38 mm. Also, the width $W_6$ is less than 0.45 mm and the length $L_3$ is less than 2.1 mm, preferably, within a range of 0.3 mm to 1.85 mm to reduce a leakage energy by vibration, and also, the width $W_S$ is less than 0.41 mm and the length $L_2$ is within a range of 0.04 mm to 0.5 mm to get a shock proof quartz crystal resonator having a reduced leakage energy by vibration.

Moreover, the distance $W_4$ and the width $W_2$ are constructed so that $W_4 \geq W_2$, and more, the distance $W_4$ is within a range of 0.045 mm to 0.65 mm and the width $W_2$ is within a range of 0.02 mm to 0.12 mm because it is easy to form a resonator shape and grooves formed at the vibrational arms separately by a photo-lithographic process and an etching process, consequently, a frequency stability for a fundamental mode of vibration of the resonator gets higher than that for a second overtone mode of vibration thereof. In this embodiment, a quartz wafer having a thickness t of 0.045 mm to 0.35 mm is used.

For example, in order to get a smaller-sized quartz crystal tuning fork resonator, capable of vibrating in a flexural mode, it is necessary that the width $W_2$ of the groove is less than 0.07 mm and the arm width W is less than 0.18 mm, and preferably, the W is greater than 0.05 mm and less than 0.1 mm. Also, the thickness $t_1$ of the groove is within a range of 0.01 mm to 0.085 mm approximately, and the part widths $W_1$ and $W_3$ are less than 0.021 mm, respectively, preferably, less than 0.015 mm. In addition, a groove provided on at least one of an obverse face and a reverse face of the vibrational arms of this embodiment may be a through hole, namely, the thickness of the hole $t_1$=0.

In more detail, to obtain a quartz crystal tuning fork resonator, capable of vibrating in a flexural mode, and having a frequency of high stability which achieves high time accuracy, it is necessary to obtain the resonator whose resonance frequency is not influenced by shunt capacitance because quartz crystal is a piezoelectric material and the stability for frequency is very dependent on the shunt capacitance. In order to decrease the influence on the resonance frequency by the shunt capacitance, a merit value $M_i$ plays an important role. Namely, the merit value $M_i$ that expresses inductive characteristics, an electromechanical transformation efficiency and a quality factor of a quartz crystal tuning fork resonator, is defined by a ratio $Q_i/r_i$ of a quality factor $Q_i$ and capacitance ratio $r_i$, namely, $M_i$ is given by $M_i=Q_i/r_i$ where i shows a vibration order of the resonator, and for example, when i=1 and 2, merit values $M_1$ and $M_2$ are for a fundamental mode of vibration of the resonator and a second overtone mode of vibration thereof, respectively.

Also, a frequency difference Δf of resonance frequency $f_s$ of mechanical series independent on the shunt capacitance and resonance frequency $f_r$ dependent on the shunt capacitance is inversely proportional to the merit value $M_i$. The larger the value $M_i$ becomes, the smaller the difference Δf becomes. Namely, the influence on the resonance frequency $f_r$ by the shunt capacitance decreases because it is close to the resonance frequency $f_s$. Accordingly, the larger the $M_i$ becomes, the higher the stability for frequency of the quartz crystal tuning fork resonator becomes because the resonance frequency $f_r$ of the resonator is almost never dependent on the shunt capacitance. Namely, the quartz crystal tuning fork resonator can be provided with a high time accuracy.

In detail, the quartz crystal tuning fork resonator can be obtained with the merit value $M_1$ of the fundamental mode of vibration greater than the merit value $M_2$ of the second overtone mode of vibration by providing the above-described tuning fork shape, grooves and dimensions. That is to say, a relationship of $M_1 > M_2$ is obtained. As an example, when a resonance frequency of a quartz crystal tuning fork resonator capable of vibrating in a flexural mode is about 32.768 kHz for a fundamental mode of vibration and the resonator has a value of $W_2/W$=0.5, $t_1/t$=0.34 and $l_1/l$=0.48, though there is a distribution in production, the resonator has a merit value of $M_1 > 65$ for the fundamental mode of vibration and a merit value of $M_2 < 30$ for the second overtone mode of vibration, respectively.

Namely, the quartz crystal tuning fork resonator can be provided with high inductive characteristics, good electromechanical transformation efficiency (small capacitance ratio $r_1$ and small series resistance $R_1$) and a high quality factor. As a result, a stability for frequency of the fundamental mode of vibration becomes higher than that of the second overtone mode of vibration, and simultaneously, the second overtone mode of vibration can be suppressed because capacitance ratio $r_2$ and series resistance $R_2$ of the second overtone mode of vibration become greater than capacitance ratio $r_1$ and series resistance $R_1$ of the fundamental mode of vibration, respectively. In particular, $r_2$ has a value greater than 1500 in this embodiment.

Therefore, the resonator capable of vibrating in the fundamental mode vibration can be provided with a high time accuracy because it has the frequency of high stability. Consequently, a quartz crystal oscillator comprising the quartz crystal tuning fork resonator of this embodiment outputs an oscillation frequency of the fundamental mode vibration as an output signal, and the frequency of the output signal has a very high stability, namely, excellent time accuracy. In other words, the quartz crystal oscillator of this embodiment has a remarkable effect such that a frequency change by ageing becomes extremely small. Also, an oscillation frequency of the quartz crystal resonator of this embodiment is adjusted so that a frequency deviation is within a range of –100 PPM to +100 PPM to a nominal frequency, e.g. 32.768 kHz, after mounting it on a mounting portion of a case for housing the resonator.

In addition, the groove thickness $t_1$, shown in FIG. 3, of the present invention is the thinnest thickness of the grooves because quartz crystal is an anisotropic material and the groove thickness $t_1$ has a distribution when it is formed by a chemical etching method. In detail, a groove shape of the sectional view of vibrational arms in FIG. 3 has a rectangular shape, but the groove shape has an about U shape actually. In the above-described embodiments, though the grooves are constructed at the arms, this invention is not limited to this, namely, a relationship of the merit values $M_1$ and $M_2$ can be applied to the conventional quartz crystal tuning fork resonator and a relationship of a quartz crystal oscillating circuit comprising an amplification circuit and a feedback circuit can be also applied to the conventional quartz crystal tuning fork resonator to suppress a second overtone mode vibration and to get a high frequency stability for a fundamental mode of vibration of the quartz crystal tuning fork resonator.

FIG. 3 shows an A–A' cross-sectional view of the vibrational arms 20 and 31 of the quartz crystal resonator 10 in FIG. 2, and electrode construction within the grooves. The vibrational arm 20 has grooves 21 and 22 cut into it, which include a portion of central linear line of the arm 20. The grooves 21 and 22 have a first set of electrodes 23 and 24 of the same electrical polarity, while the side surfaces of the arm 20 have a second set of electrodes 25 and 26 having an opposite electrical polarity to the first set of electrodes 23 and 24. The vibrational arm 31 has grooves 27 and 28 constructed in a similar manner as the vibrational arm 20. The grooves 27 and 28 have a third set of electrodes 29 and 30 of the same electrical polarity, and the side surfaces of the vibrational arm 31 have a fourth set of electrodes 32 and 33 with the opposite electrical polarity to the third electrodes 29 and 30. The electrodes disposed on the vibrational arms 20 and 31 are connected as shown in FIG. 3, namely, two electrode terminals of different electrical polarity C–C' are obtained.

In detail, the first set of electrodes 23 and 24 disposed on the grooves 21 and 22 of the vibrational arm 20 have the same electrical polarity as the fourth set of electrodes 32 and 33 disposed on both side surfaces of the vibrational arm 31, while the second set of electrodes 25 and 26 disposed on both side surfaces of the vibrational arm 20 have the same electrical polarity as the third set of electrodes 29 and 30 disposed on the grooves 27 and 28 of the arm 31. When a direct voltage is applied between the electrode terminals C–C', an electric field Ex occurs along the arrow direction inside the vibrational arms 20 and 31. As the electric field Ex occurs perpendicular to the electrodes disposed on the vibrational arms, as shown in the arrow signs, the electric field Ex has a very large value and a large distortion occurs at the vibrational arms. As a result, a quartz crystal tuning fork resonator capable of vibrating in a flexural mode is obtained with a small series resistance $R_1$ and a high quality factor Q because even when miniaturized there is a very large electromechanical transformation efficiency for the resonator.

Figure 4:
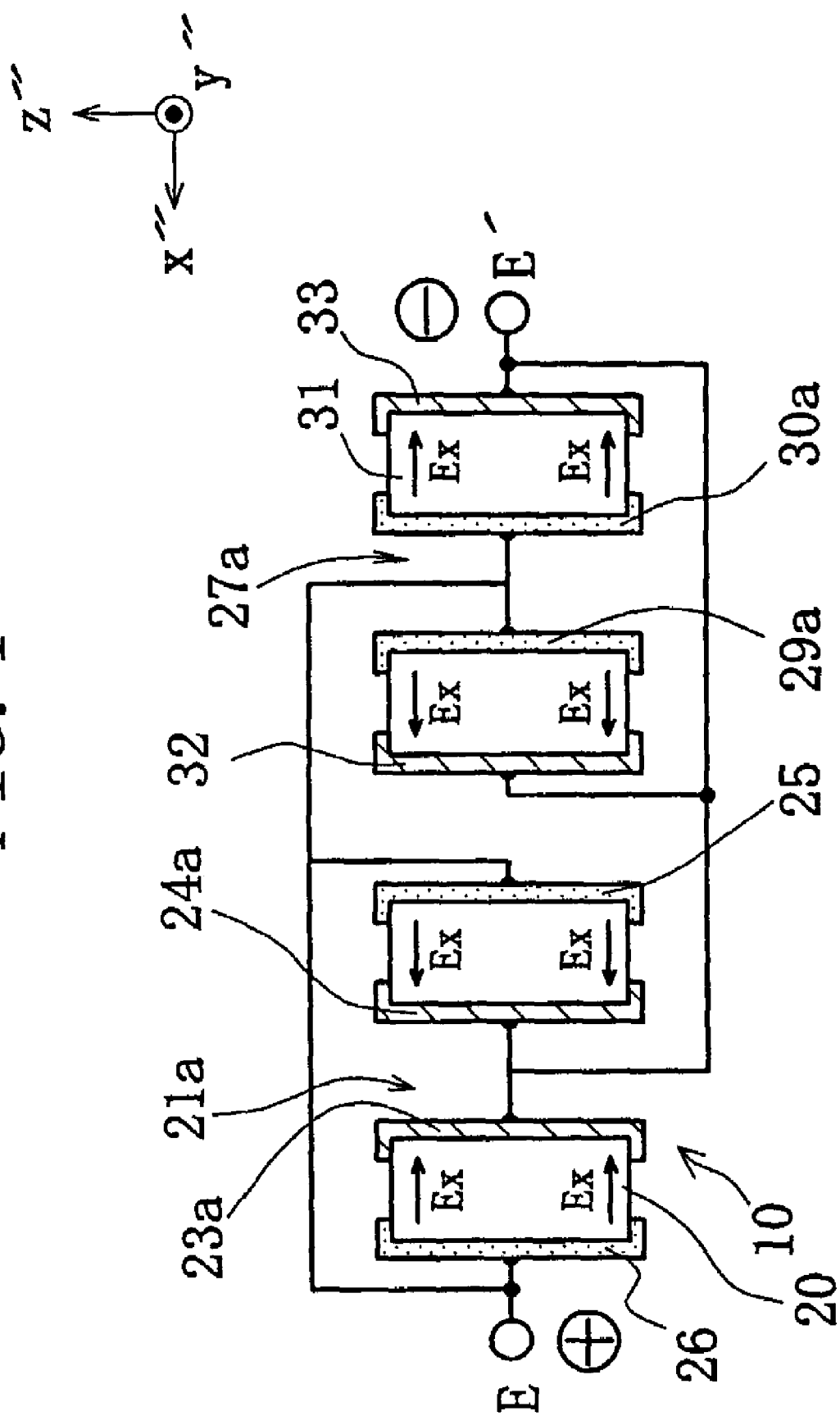
FIG. 4 shows an A–A' cross-sectional view of another embodiment of the vibrational arms of the quartz crystal resonator in FIG. 2.

FIG. 4 shows an A–A' cross-sectional view of another embodiment of the vibrational arms 20 and 31 of the quartz crystal resonator 10 in FIG. 2. The vibrational arm 20 has a through groove 21a, which include a portion of central linear line of the arm 20. The through groove 21a has a first set of electrodes 23a and 24a of the same electrical polarity, while the side surfaces of the arm 20 have a second set of electrodes 25 and 26 having an opposite electrical polarity to the first set of electrodes 23a and 24a. The vibrational arm 31 has a through groove 27a constructed in a similar manner as the vibrational arm 20. The through groove 27a has a third set of electrodes 29a and 30a of the same electrical polarity, and the side surfaces of the vibrational arm 31 have a fourth set of electrodes 32 and 33 with the opposite electrical polarity to the third electrodes 29a and 30a. The electrodes disposed on the vibrational arms 20 and 31 are connected as shown in FIG. 4, namely, two electrode terminals of different electrical polarity E–E' are obtained.

In detail, the first set of electrodes 23a and 24a disposed on the through groove 21a of the vibrational arm 20 have the same electrical polarity as the fourth set of electrodes 32 and 33 disposed on both side surfaces of the vibrational arm 31, while the second set of electrodes 25 and 26 disposed on both side surfaces of the vibrational arm 20 have the same electrical polarity as the third set of electrodes 29a and 30a disposed on the through groove 27a of the arm 31. When a direct voltage is applied between the electrode terminals E–E', an electric field Ex occurs along the arrow direction inside the vibrational arms 20 and 31. As the electric field Ex occurs perpendicular to the electrodes disposed on the vibrational arms, as shown in the arrow signs, the electric field Ex has a very large value and a large distortion occurs at the vibrational arms. As a result, a quartz crystal tuning fork resonator capable of vibrating in a flexural mode is obtained with a small series resistance $R_1$ and a high quality factor Q because even when miniaturized there is a very large electromechanical transformation efficiency for the resonator.

Figure 5:
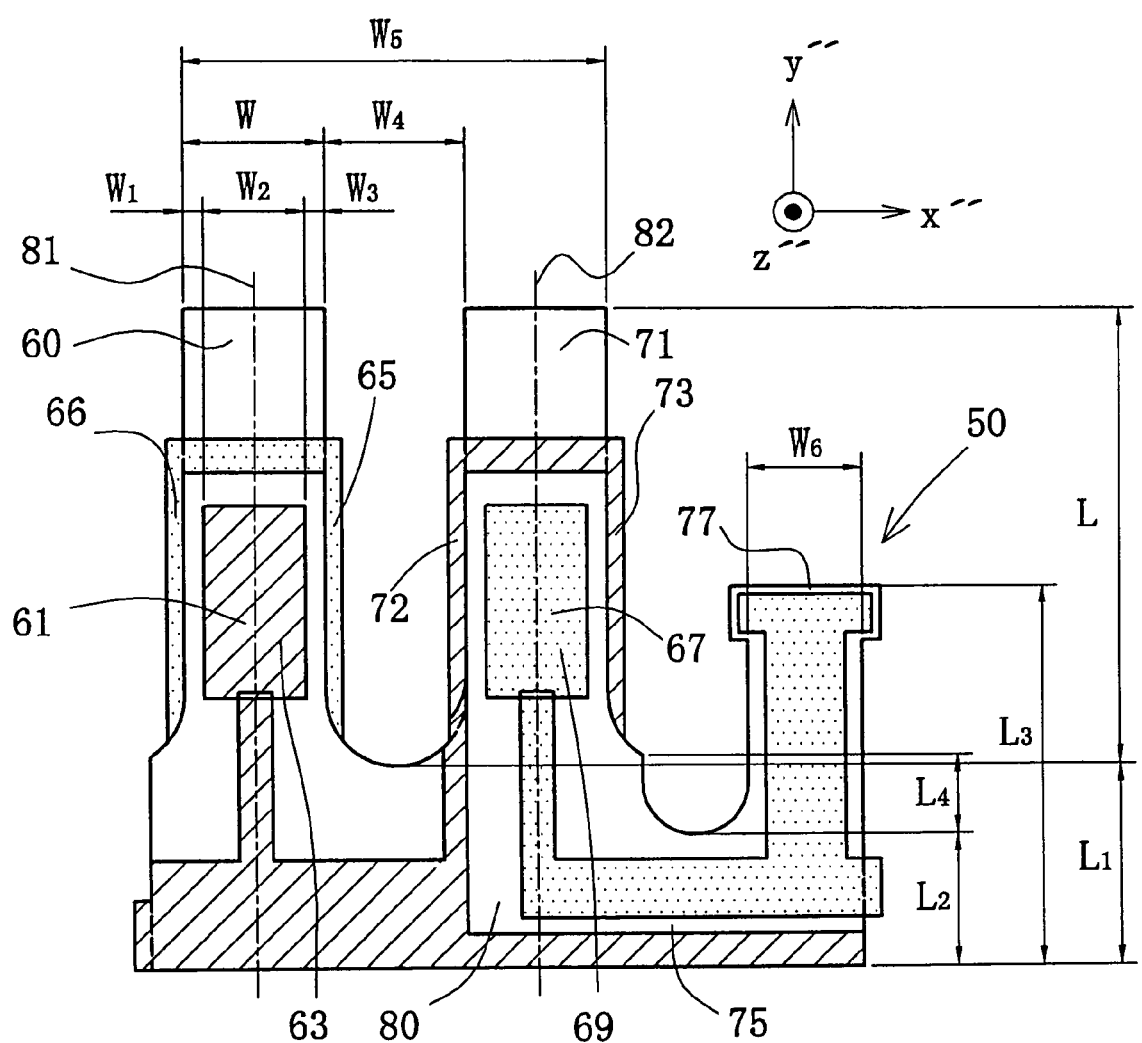
FIG. 5 shows a plan view of a quartz crystal resonator of a second embodiment of the present invention, and comprising a quartz crystal tuning fork resonator capable of vibrating in a flexural mode.

FIG. 5 shows a plan view of a quartz crystal resonator 50 of a second embodiment of the present invention, and which is a quartz crystal tuning fork resonator capable of vibrating in a flexural mode. The resonator 50 comprises vibrational arms 60 and 71 and a base portion 80 attached to the vibrational arms, and the base portion 80. has a mounting arm 77 protruding from the base portion, and the mounting arm 77 is mounted on a mounting portion of a package comprising a case for housing the resonator and a lid for covering an open end of the case. In addition, each of the vibrational arms 60 and 71 has a first main surface and a second main surface and side surfaces, and the vibrational arms 60 and 71 have grooves 61 and 67, respectively, each of which has stepped portions comprising a first stepped portion and a second stepped portion. Also, the resonator 50 has the same cutting angles $\theta_y$, $\theta_x$ and $\theta_z$ and the same dimensions $W_1$, $W_2$, $W_3$, $W_4$, $W_5$, W, $L_1$, $L_2$, $L_3$, $L_4$ and L as the resonator of FIG. 2.

In more detail, the groove 61 is constructed to include a portion of a central linear line 81 of the arm 60, and the groove 67 is similarly constructed to include a portion of a central linear line 82 of the arm 71. Each of the grooves 61 and 67 has a width $W_2$, and the width $W_2$ includes a portion of the central linear lines 81 and 82 because a large moment of inertia occurs at the arms 60 and 71. In this embodiment, the resonator is a quartz crystal tuning fork resonator capable of vibrating in a flexural mode and which can vibrate in a fundamental mode of an inverse phase easily. As a result, the quartz crystal tuning fork resonator capable of vibrating in a fundamental mode of an inverse phase can be obtained with a small series resistance $R_1$ and a high quality factor $Q_1$.

In addition, electrodes 65 and 66 are disposed on side surfaces of the vibrational arm 60 and an electrode 63 is disposed on a surface of the groove 61, and which is connected to electrodes 72 and 73 disposed on side surfaces of the vibrational arm 71. Similar to this, an electrode 69 is disposed on a surface of the groove 67, which extends into the mounting arm 77 having a connecting portion 75. Also, the electrode 69 is connected to the electrodes 65 and 66.

Figure 6:
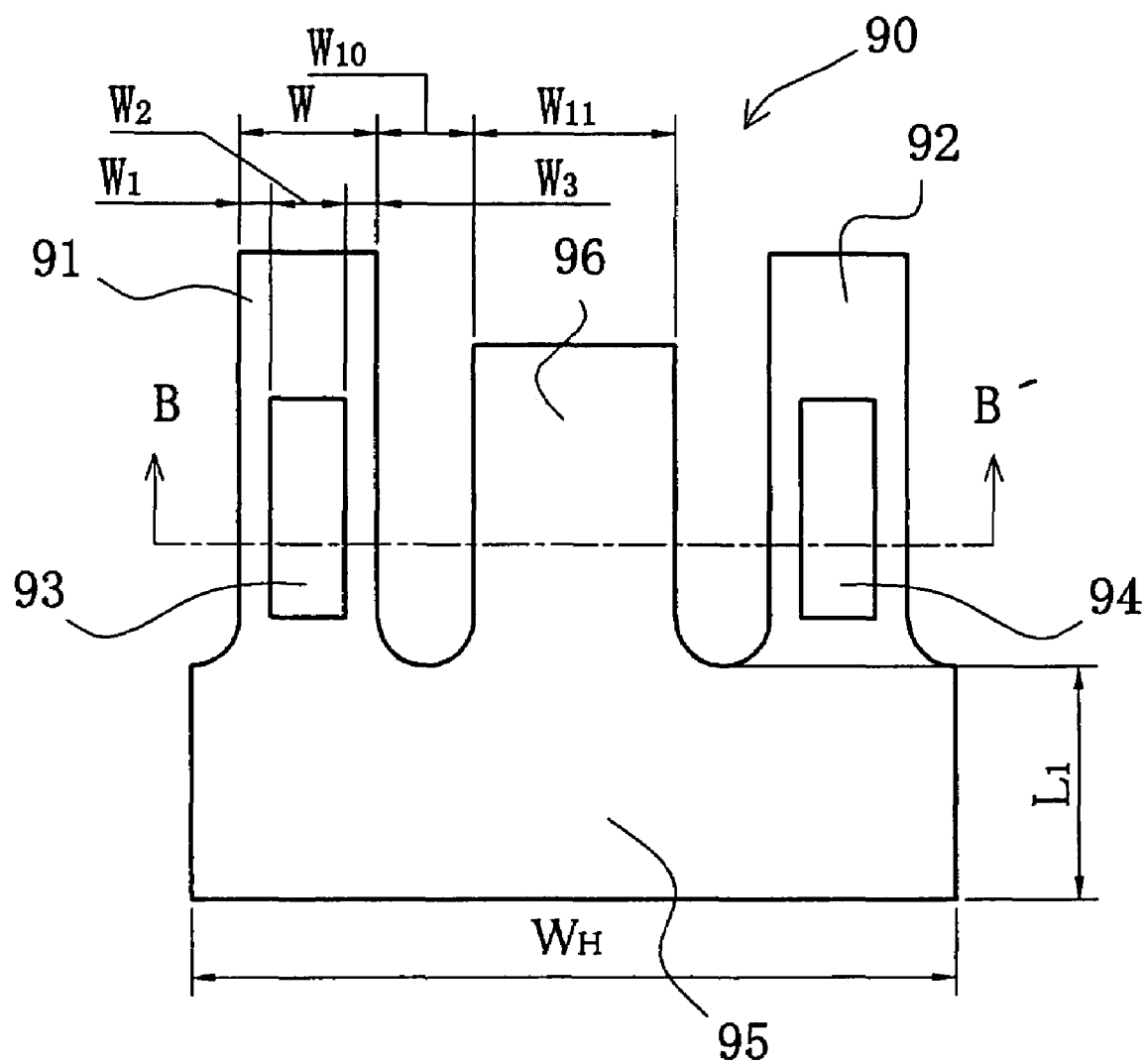
FIG. 6 shows a plan view of a quartz crystal resonator of a third embodiment of the present invention, and comprising a quartz crystal tuning fork resonator capable of vibrating in a flexural mode.

FIG.6 shows a plan view of a quartz crystal resonator 90 of a third embodiment of the present invention, which is a quartz crystal tuning fork resonator capable of vibrating in a flexural mode. The resonator 90 comprises vibrational arms 91 and 92 and a base portion 95 attached to the vibrational arms, and the base portion 90 has a mounting arm 96 protruding from the base portion. In this embodiment, the mounting arm 96 is between the vibrational arms 91 and 92 and is mounted on a mounting portion of a package comprising a case for housing the resonator and a lid for covering an open end of the case. In addition, each of the vibrational arms 91 and 92 has a first main surface and a second main surface opposite the first main surface and side surfaces, and the vibrational arms 91 and 92 have grooves 93 and 94, respectively, each of which has stepped portions comprising a first stepped portion and a second stepped portion. Also, the resonator 90 has the same cutting angles $\theta_y$, $\theta_x$ and $\theta_z$ as the quartz crystal resonator 10 of FIG. 2. In this embodiment, the quartz crystal tuning fork resonator can vibrate in a flexural mode of a fundamental mode of an inverse phase.

In detail, similar to the resonator of FIG. 2, the groove 93 is also constructed to include a portion of a central linear line of the arm 91, and also, the groove 94 is similarly constructed to include a portion of a central linear line of the arm 92. Each of the grooves 93 and 94 has a width $W_2$, and the width $W_2$ includes a portion of the central linear lines because a large moment of inertia occurs at the vibrational arms 91 and 92 and which can vibrate in a flexural mode easily. As a result, the quartz crystal tuning fork resonator capable of vibrating in a fundamental mode can be obtained with a small series resistance $R_1$ and a high quality factor $Q_1$.

In addition, the base portion 95 has a length $L_1$ and a width $W_H$. Also, each of the vibrational arms 91 and 92 has a width W, part widths $W_1$ and $W_3$ and a width $W_2$ of the groove, namely, there is a relationship of $W=W_1+W_2+W_3$. In detail, the resonator 90 has the same dimensions $L_1$, $W_H$, $W_1$, $W_2$, $W_3$, and W and the same relationship as the resonator 10 of FIG. 2. Moreover, the mounting arm 96 has a width $W_{11}$, and there is a distance $W_{10}$ between the vibrational arm 91 or the vibrational arm 92 and the mounting arm 96. In order to get a quartz crystal tuning fork resonator with reduced leakage energy by vibration of the vibrational arms, the distance $W_{10}$ is within a range of 0.032 mm to 0.21 mm and the width $W_{11}$ is within a range of 0.21 mm to 0.88 mm. In addition, to get a shockproof quartz crystal tuning fork resonator, $W_{11}$ has a relationship of (1.2 to 7.6)×W. In this embodiment, a total width $W_t(=2W+2W_{10}+W_{11})$ is less than 1.3 mm, preferably, within a range of 0.52 mm to 1.2 mm, to get a miniature quartz crystal tuning fork resonator.

Figure 7:
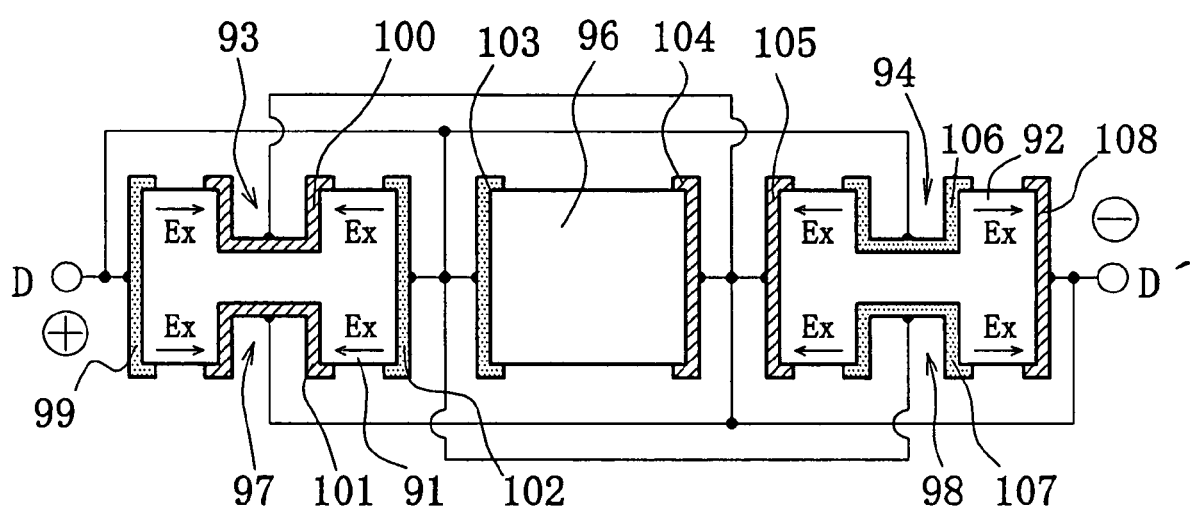
FIG. 7 shows a B–B' cross-sectional view of the vibrational arms of the resonator in FIG. 6.

FIG. 7 shows a B–B' cross-sectional view of the vibrational arms 91 and 92 of the resonator 90 in FIG. 6. The vibrational arm 91 has grooves 93 and 97 cut into it, and the grooves 93 and 97 have a first set of electrodes 100 and 101 of the same electrical polarity, while the side surfaces of the arm 91 have a second set of electrodes 99 and 102 having an opposite electrical polarity to the first set of electrodes 100 and 101. The vibrational arm 92 has grooves 94 and 98 constructed in a similar manner as the vibrational arm 91. The grooves 94 and 98 have a third set of electrodes 106 and 107 of the same electrical polarity, and the side surfaces of the vibrational arm 92 have a fourth set of electrodes 105 and 108 with the opposite electrical polarity to the third electrodes 106 and 107. The electrodes disposed on the vibrational arms 91 and 92 are connected as shown in FIG. 7, namely, two electrode terminals of different electrical polarity D–D' are obtained.

In detail, the first set of electrodes 100 and 101 disposed on the grooves 93 and 97 of the vibrational arm 91 have the same electrical polarity as the fourth set of electrodes 105 and 108 disposed on both side surfaces of the vibrational arm 92 and an electrode 104 disposed on the mounting arm 96, while the second set of electrodes 99 and 102 disposed on both side surfaces of the vibrational arm 91 have the same electrical polarity as the third set of electrodes 106 and 107 disposed on the grooves 94 and 98 of the arm 92 and an electrode 103 disposed on the mounting arm 96. When a direct voltage is applied between the electrode terminals D–D', an electric field Ex occurs along the arrow direction inside the vibrational arms 91 and 92. As the electric field Ex occurs perpendicular to the electrodes disposed on the vibrational arms, as shown in the arrow signs, the electric field Ex has a very large value and a large distortion occurs at the vibrational arms. Consequently, a quartz crystal tuning fork resonator capable of vibrating in a flexural mode is obtained with a small series resistance $R_1$ and a high quality factor Q because even when miniaturized, there is very large electromechanical transformation efficiency for the resonator.

Figure 8:
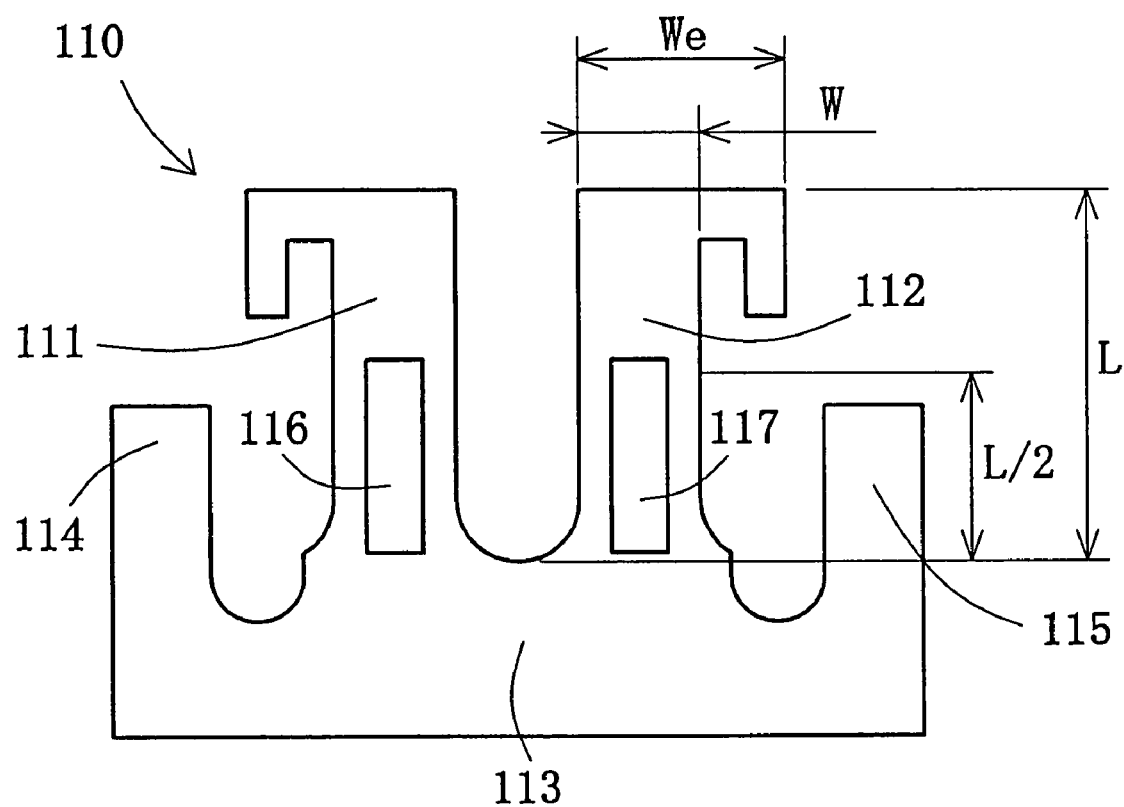
FIG. 8 shows a plan view of a quartz crystal resonator of a fourth embodiment of the present invention, and comprising a quartz crystal tuning fork resonator capable of vibrating in a flexural mode.

FIG. 8 shows a plan view of a quartz crystal resonator 110 of a fourth embodiment of the present invention, which is a quartz crystal tuning fork resonator. The resonator 110 comprises vibrational arms 111 and 112 and a base portion 113 attached to the vibrational arms, and the base portion 113 has mounting arms 114 and 115 protruding from the base portion, each of which is mounted on a mounting portion of a package comprising a case for housing the resonator and a lid for covering an open end of the case. In this embodiment, the vibrational arms 111 and 112 have grooves 116 and 117, respectively. In more detail, each of the vibrational arms 111 and 112 has an end portion connected to the base portion and a free end portion, when a distance measured from the end portion to the free end portion is a length L, each of the vibrational arms has a width W between the end portion and half a length L/2 of each of the vibrational arms and a width $W_e$ between half the length L/2 and the length L of the free end portion of each of the vibrational arms, and the width W is less than the width $W_e$. In this embodiment, the quartz crystal tuning fork resonator can vibrate in a flexural mode and vibrate in a fundamental mode of an inverse phase.

Figure 9:
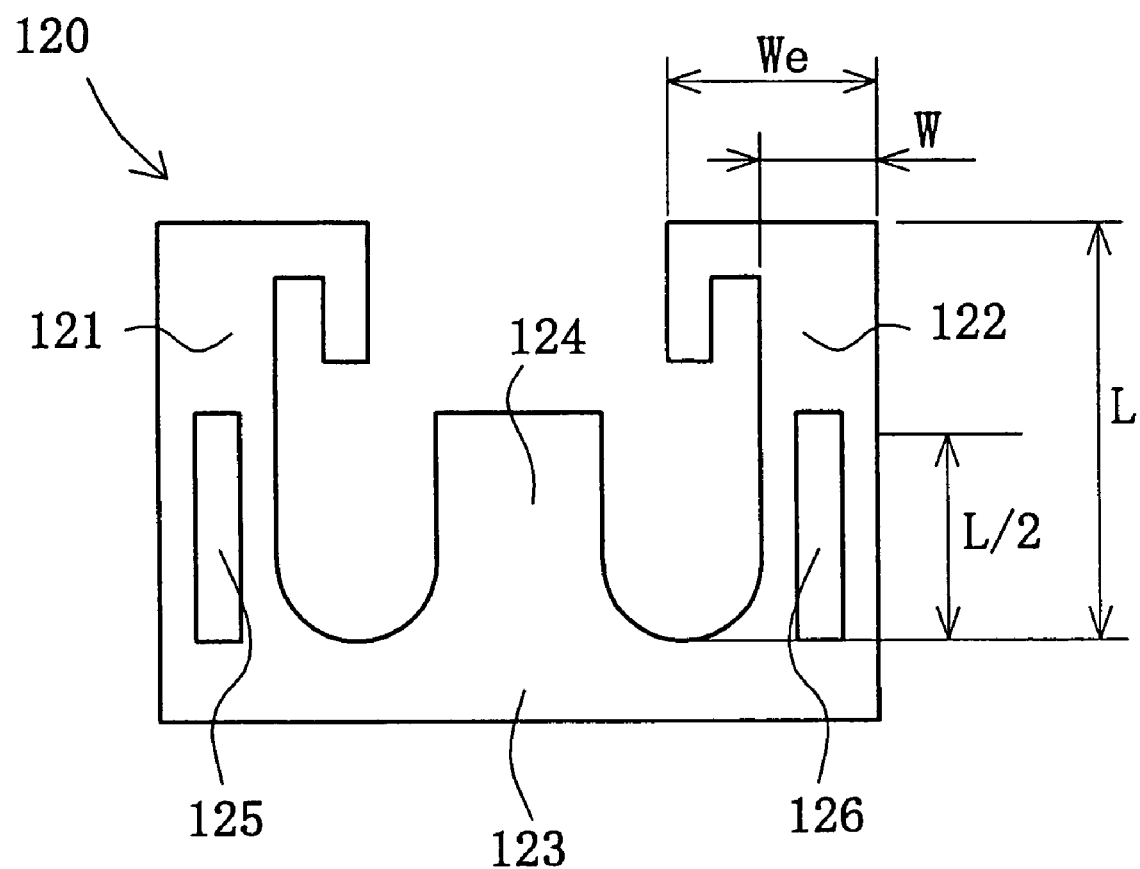
FIG. 9 shows a plan view of a quartz crystal resonator of a fifth embodiment of the present invention, and comprising a quartz crystal tuning fork resonator capable of vibrating in a flexural mode.

Similar to this, a quartz crystal tuning fork resonator 120 of a fifth embodiment of the present invention is shown in FIG. 9 showing a plan view thereof. The resonator 120 comprises vibrational arms 121 and 122 and a base portion 123 attached to the vibrational arms, and the base portion 123 has a mounting arm 124 protruding from the base portion. In this embodiment, the mounting arm 124 is between the vibrational arms 121 and 122 and the vibrational arms 121 and 122 have grooves 125 and 126, respectively. For this case the width W is also less than the width We similar to that of FIG. 8.

Figure 10:
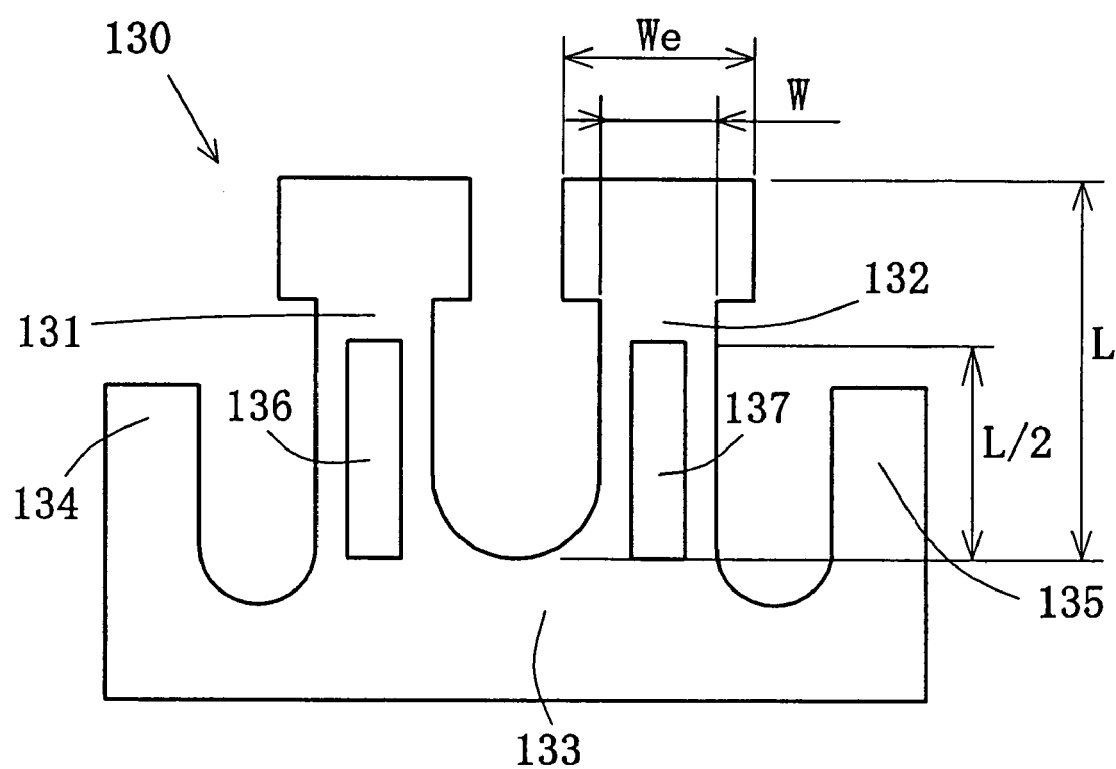
FIG. 10 shows a plan view of a quartz crystal resonator of a sixth embodiment of the present invention, and comprising a quartz crystal tuning fork resonator capable of vibrating in a flexural mode.

FIG. 10 shows a plan view of a quartz crystal resonator 130 of a sixth embodiment of the present invention, which is a quartz crystal tuning fork resonator. The resonator 130 comprises vibrational arms 131 and 132 and a base portion 133 attached to the vibrational arms, and the base portion 133 has mounting arms 134 and 135 protruding from the base portion, each of which is mounted on a mounting portion of a package comprising a case for housing the resonator and a lid for covering an open end of the case. In this embodiment, the vibrational arms 131 and 132 have grooves 136 and 137, respectively. In more detail, each of the vibrational arms 131 and 132 has an end portion connected to the base portion and a free end portion, when a distance measured from the end portion to the free end portion is a length L, each of the vibrational arms has a width W between the end portion and half a length L/2 of each of the vibrational arms and a width $W_e$ between half the length L/2 and the length L of the free end portion of each of the vibrational arms, and the width W is less than the width $W_e$. In this embodiment, the quartz crystal tuning fork resonator can vibrate in a flexural mode and vibrate in a fundamental mode of an inverse phase.

Figure 11:
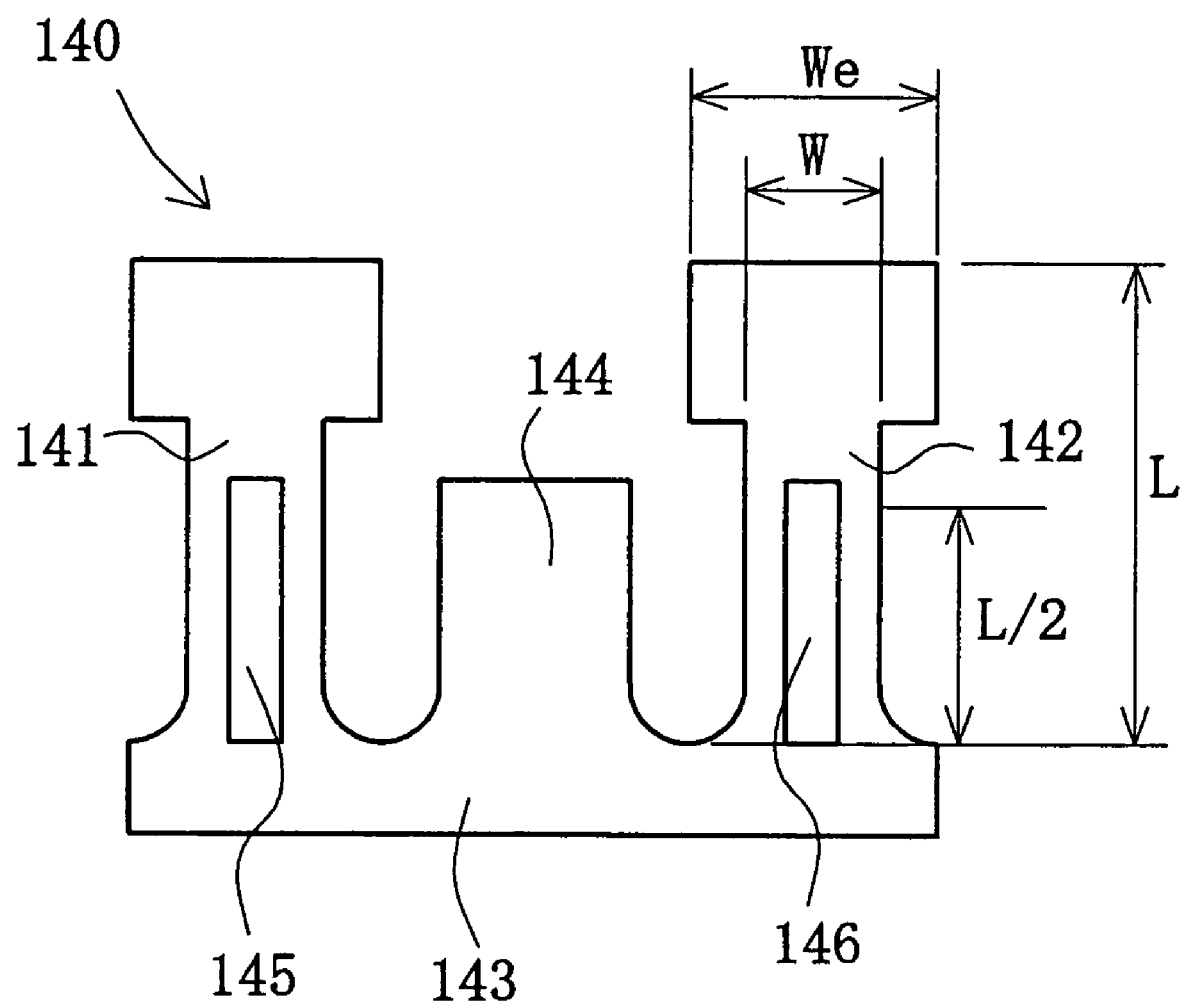
FIG. 11 shows a plan view of a quartz crystal resonator of a seventh embodiment of the present invention, and comprising a quartz crystal tuning fork resonator capable of vibrating in a flexural mode.

Similar to this, a quartz crystal tuning fork resonator 140 of a seventh embodiment of the present invention is shown in FIG. 11 showing a plan view thereof. The resonator 140 comprises vibrational arms 141 and 142 and a base portion 143 attached to the vibrational arms, and the base portion 143 has a mounting arm 144 protruding from the base portion. In this embodiment, the mounting arm 144 is between the vibrational arms 141 and 142 and the vibrational arms 141 and 142 have grooves 145 and 146, respectively. For this case the width W is also less than the width We similar to that of FIG. 10.

Especially, the quartz crystal tuning fork resonator of the fourth embodiment to the seventh embodiment can be miniaturized with a small series resistance $R_1$ and a high quality factor $Q_1$ because it has a width $W_e$ greater than a width W, and the width $W_e$ operates as a mass.

Next, a value of a piezoelectric constant $e'_{12}$ is described, which is of great importance and necessary to excite a quartz crystal tuning fork resonator capable of vibrating in a flexural mode of the present invention. The larger a value of the piezoelectric constant $e'_{12}$ becomes, the higher electromechanical transformation efficiency becomes. The piezoelectric constant $e'_{12}$ of the present invention can be defined by a function of the cutting angles $\theta_y$, $\theta_x$ and $\theta_z$ shown in FIG. 1, and piezoelectric constants $e_{11}=0.171$ C/m² and $e_{14}=-0.0406$ C/m² of quartz crystal. In order to obtain a quartz crystal tuning fork resonator, capable of vibrating in a flexural mode and having a small series resistance $R_1$ and a high quality factor Q, the piezoelectric constant $e'_{12}$ of the present invention is within a range of 0.1 C/m² to 0.19 C/m² in the absolute value. It is, therefore, easily understood that this value is enough large to obtain the quartz crystal tuning fork resonator with a small series resistance $R_1$ and a high quality factor Q.

Especially, in order to obtain a quartz crystal tuning fork resonator capable of vibrating in a flexural mode with a much smaller series resistance $R_1$, the piezoelectric constant $e'_{12}$ is preferably within a range of 0.12 C/m² to 0.19 C/m² in the absolute value.

In addition, as an example, a quartz crystal tuning fork resonator comprises a plurality of vibrational arms having a first vibrational arm and a second vibrational arm, and a groove having a first stepped portion and a second stepped portion is formed in at least one of a first main surface and a second main surface of each of the first and second vibrational arms, in which a first electrode is disposed on the first stepped portion of the groove, a second electrode is disposed on the second stepped portion of the groove, and a third electrode is disposed on each of side surfaces of each of the first and second vibrational arms, in which the piezoelectric constant $e'_{12}(=e'_{12i})$ is between the first electrode and the third electrode disposed opposite to the first electrode, and the piezoelectric constant $e'_{12}(=e'_{12o})$ is between the second electrode and the third electrode disposed opposite to the second electrode, and in which the piezoelectric constants $e'_{12i}$ and $e'_{12o}$ are within the range of 0.12 C/m² to 0.19 C/m² in the absolute value, respectively, and a product of the $e'_{12i}$ and the $e'_{12o}$ is greater than 0.

As an another example, a quartz crystal tuning fork resonator comprises a plurality of vibrational arms having a first vibrational arm and a second vibrational arm, and a through hole having a first side surface and a second side surface is formed in each of the first and second vibrational arms, in which a first electrode is disposed on the first side surface of the through hole, a second electrode is disposed on the second side surface of the through hole, and a third electrode is disposed on each of side surfaces of each of the first and second vibrational arms, in which the piezoelectric constant $e'_{12}(=e'_{12i})$ is between the first electrode and the third electrode disposed opposite to the first electrode, and the piezoelectric constant $e'_{12}(=e'_{12o})$ is between the second electrode and the third electrode disposed opposite to the second electrode, and in which the piezoelectric constants $e_{12i}$ and $e_{12o}$ are within the range of 0.12 C/m² to 0.19 C/m² in the absolute value, respectively, and a product of the $e'_{12i}$ and the $e'_{12o}$ is greater than 0.

Therefore, the quartz crystal tuning fork resonator described above has a small series resistance $R_1$ and a high quality factor Q, and also a frequency of high stability.

Figure 12:
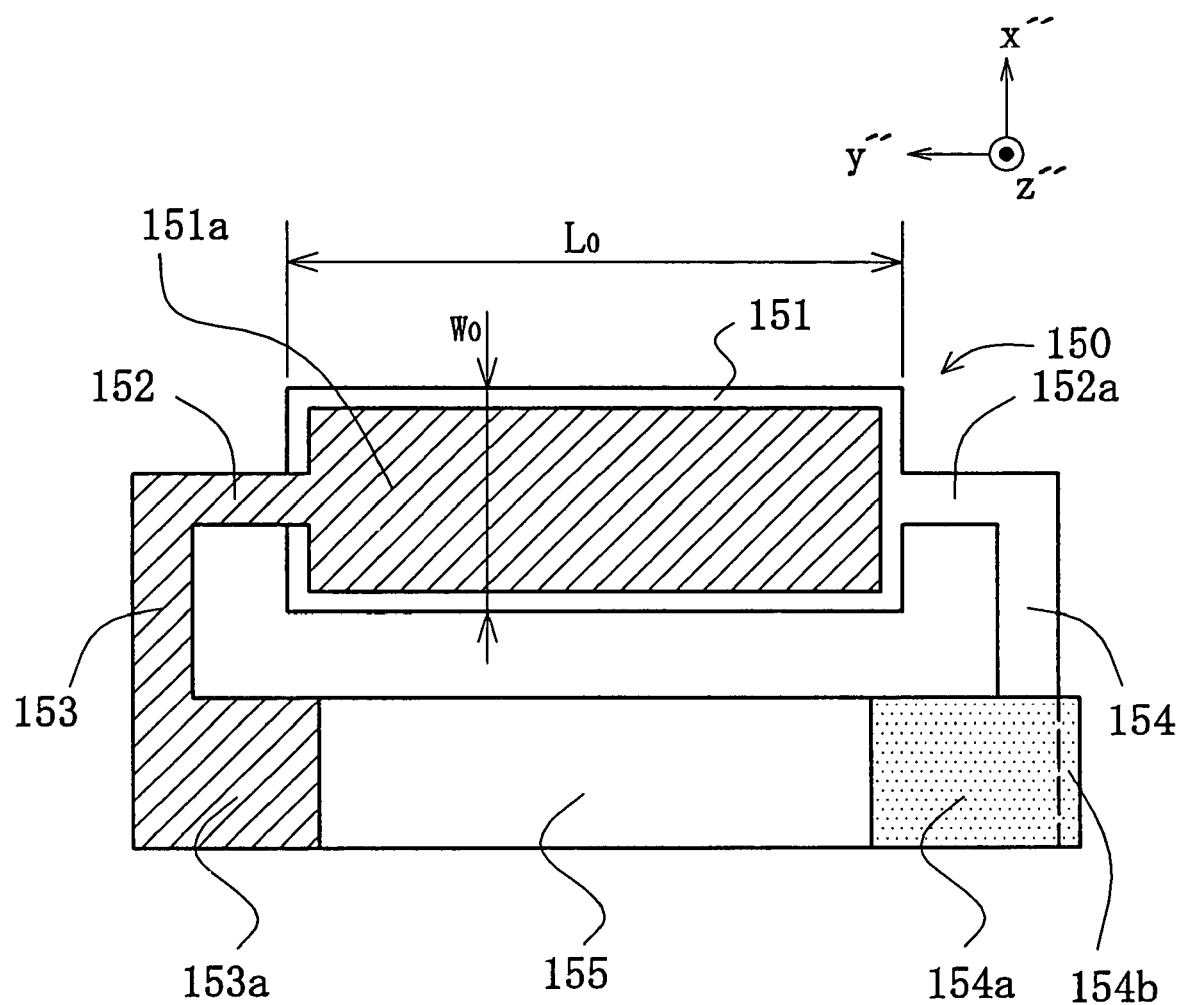
FIG. 12 shows a plan view of a width-extensional mode quartz crystal resonator constructing an electronic apparatus of the present invention.

FIG. 12 shows a plan view of a width-extensional mode quartz crystal resonator 150 constructing an electronic apparatus of the present invention, and which vibrates in a width-extensional mode. The width-extensional mode resonator 150 comprises a vibrational portion 151, connecting portions 152, 152a and supporting portions 153 and 154 connected to a mounting portion 155 constructing the supporting portions. Namely, the vibrational portion 151 is connected to the supporting portions 153, 154 having the mounting portion 155 through the connecting portions 152, 152a. In addition, an electrode 151a is disposed on an obverse surface of the vibrational portion 151 and an electrode 151b (not visible) is disposed on a reverse surface of the vibrational portion 151.

In more detail, the electrode 151a disposed on the obverse surface of the vibrational portion 151 is connected to an electrode 153a disposed on the mounting portion 155, while the electrode 151b disposed on the reverse surface of the vibrational portion 151 is connected to an electrode 154a disposed on the mounting portion 155 through an electrode 154b disposed on a side surface of the mounting portion. Namely, a pair of electrodes is disposed on the obverse and reverse surfaces of the vibrational portion 151. Also, the vibrational portion 151 has a width $W_0$ and a length $L_0$. In general, a ratio $W_0/L_0$ is less than 0.35. In addition, the mounting portion 155 is mounted on a mounting portion of a package comprising a case for housing the resonator and a lid for covering an open end of the case. In this embodiment, a cutting angle of the resonator is within a range of ZYlwt (80° to 100°)/(−10° to +10°)/(75° to +115°) and a piezoelectric constant $e'_{31}$ of the resonator is within a range of 0.1 C/m² to 0.19 C/m² in the absolute value to obtain the resonator with a small series resistance $R_1$ and a high quality factor Q.

Similar to this, a length-extensional mode quartz crystal resonator can be obtained by replacing the width $W_0$ with the length $L_0$. In this case the connecting portions are formed in the width direction. In this embodiment, a cutting angle of the length-extensional mode resonator is within a range of ZYlwt (80° to 100°)/(−10° to +10°)/(−35° to +35°) and a piezoelectric constant $e'_{32}$ of the resonator is within a range of 0.12 C/m² to 0.19 C/m² in the absolute value to obtain the resonator with a small series resistance $R_1$ and a high quality factor Q.

FIG. 13(a) and FIG. 13(b) show a plan view of a thickness shear mode quartz crystal resonator 156 constructing an electronic apparatus of the present invention and a F–F' sectional view of the thickness shear mode resonator 156 capable of vibrating in a thickness shear mode. The resonator 156 comprises a vibrational portion 157 having a width $W_0$, a length $L_0$ and a thickness $T_0$, and electrodes 158 and 159 are disposed on an obverse surface and a reverse surface so that the electrodes have opposite electrical polarity each other. Namely, a pair of electrodes is disposed on the vibrational portion 157. Also, the resonator 156 is housed in a package comprising a case for housing the resonator and a lid for covering an open end of the case. In this embodiment, a cutting angle of the resonator is within a range of ZYlwt (−5° to +5°)/±(37° to 58°)/(85° to 95°) and a piezoelectric constant $e'_{34}$ of the resonator is within a range of 0.055 C/m² to 0.14 C/m² in the absolute value to obtain the resonator with a small series resistance $R_1$ and a high quality factor Q. In order to obtain much smaller series resistance $R_1$, the piezoelectric constant $e'_{34}$ of the resonator is preferably within a range of 0.085 C/m² to 0.12 C/m² in the absolute value.

Figure 14:
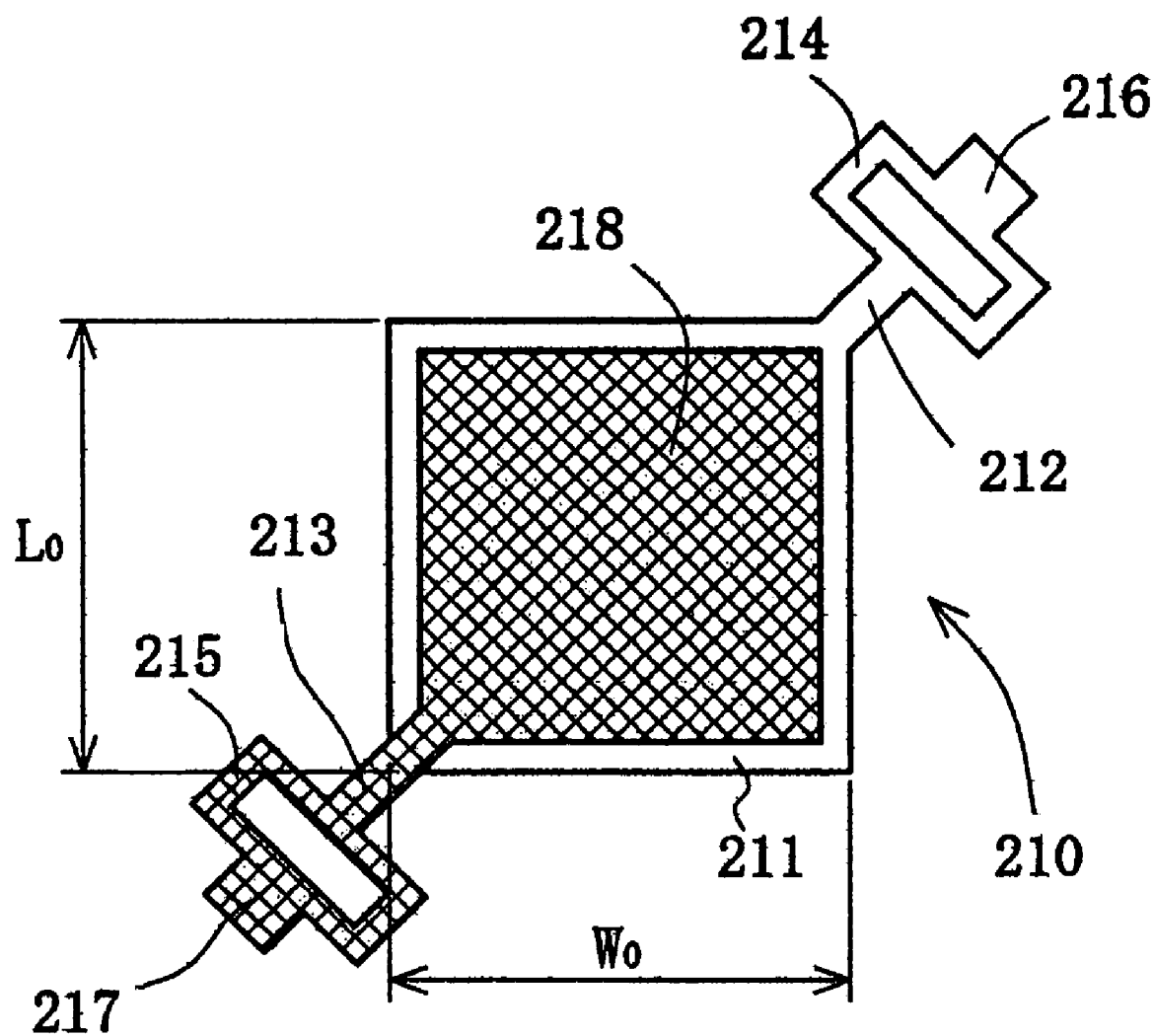
FIG. 14 shows a plan view of a Lame mode quartz crystal resonator constructing an electronic apparatus of the present invention.

FIG. 14 shows a plan view of a Lame mode quartz crystal resonator 210 constructing an electronic apparatus of the present invention, and vibrating in a Lame mode. The Lame mode resonator 210 comprises a vibrational portion 211, connecting portions 212, 213 and supporting portions 214, 215 having mounting portions 216 and 217. Namely, the vibrational portion 211 is connected to the supporting portions 214, 215 through the connecting portions 212, 213. In addition, an electrode 218 is disposed on an obverse surface of the vibrational portion 211 and an electrode 219 (not visible) is disposed on a reverse surface of the vibrational portion 211.

In more detail, the electrode 218 disposed on the obverse surface of the vibrational portion 211 is extended into the mounting portion 217, while the electrode 219 disposed on the reverse face of the vibrational portion 211 is extended into the mounting portion 216. Namely, a pair of electrodes is disposed on the obverse and reverse surfaces of the vibrational portion 151. Also, the vibrational portion 211 has a width $W_0$ and a length $L_0$. In general, a ratio $L_0/W_0$ is approximately equal to m for a fundamental mode of vibration and an overtone mode of vibration of the resonator, where m is an order of vibration of the resonator and an integer. For example, when a Lame mode quartz crystal resonator has one of m=1, 2, 3 and n, the resonator vibrates in a fundamental mode for m=1, a second overtone mode for m=2, a third overtone mode for m=3 and an $n^{th}$ overtone mode for m=n.

Also, the m has a close relationship to the number of electrodes disposed on the vibrational portion. For example, when an electrode is disposed opposite each other on both of an obverse surface and a reverse surface of the vibrational portion, this is called "the number of two electrodes", in other words, "a pair of electrodes". Namely, the vibrational portion has the number of p electrodes, where p is an even number such as 2, 4, 6, 8 and 10. As an example, when p of the vibrational portion comprises 6, the vibrational portion vibrates in a third overtone mode. In this example, three pairs of electrodes are disposed on the vibrational portion. Namely, the third overtone mode of vibration is a principal vibration. As is apparent from this relationship, there is a relationship of m=p/2.

Therefore, the principal vibration vibrates in the order of vibration corresponding to the number of an electrode pair or electrode pairs. For example, the principal vibration vibrates in a fundamental mode of vibration, a second overtone mode of vibration and a third overtone mode of vibration, respectively, for an electrode pair, two electrode pairs and three electrode pair disposed on the vibrational portion. In detail, when $m_e$ electrode pairs are disposed on the vibrational portion, the principal vibration vibrates in an $n^{th}$ overtone mode of vibration, and $m_e$ corresponds to the n, where m is an integer. It is needless to say that this concept can be applied to a width-extensional mode quartz crystal resonator and a length-extensional mode quartz crystal resonator.

In more detail, an even number of electrodes are disposed on the obverse and reverse surfaces of the vibrational portion and the electrodes disposed opposite each other has an opposite electrical polarity. In addition, each of the mounting portions 216, 217 is mounted on a mounting portion of a package comprising a case for housing the resonator and a lid for covering an open end of the case. In this embodiment, a cutting angle of the resonator is within a range of ZYlwt (−5° to +5°)/±(35° to 60°)/±(40° to 50°) and a piezoelectric constant $e'_{32}$ of the resonator is within a range of 0.045 C/m² to 0.13 C/m² in the absolute value to obtain the resonator with a small series resistance $R_1$ and a high quality factor Q.

FIG. 15(a) and FIG. 15(b) show a plan view of a resonator for sensing angular velocity constructing an electronic apparatus of the present invention and a G–G' sectional view of the resonator. In this embodiment, the resonator 220 comprises a quartz crystal tuning fork resonator, capable of vibrating in a flexural mode and comprising vibrational arms 221, 222 and a base portion 223 attached to the vibrational arms, the base portion 223 is mounted on a mounting portion of a package comprising a case for housing the resonator and a lid for covering an open end of the case. In addition, each of the vibrational arms 221 and 222 has a first main surface and a second main surface opposite the first main surface and side surfaces, and the vibrational arm 221 has grooves 224, 230, while the vibrational arm 222 has grooves 225, 237, each of which has stepped portions comprising a first stepped portion and a second stepped portion. Also, a cutting angle of the resonator is within a range of ZYlwt (−20° to +20°)/(−25° to +25°)/(−18° to +18°) and a piezoelectric constant $e'_{12}$ of the resonator is within a range of 0.1 C/m² to 0.19 C/m² in the absolute value. The resonator of this embodiment can vibrate in a flexural mode of a fundamental mode and an inverse phase.

In more detail, electrodes 226 and 227 which are of the same electrical polarity are disposed on the side surfaces such that an electrode terminal H is defined, while an electrode 228 is disposed inside the groove 224 and an electrode 229 which is of the same electrical polarity to the electrode 228 is disposed inside the groove 230 such that an electrode terminal H' of opposite electrical polarity to the electrode terminal H is defined. Namely, two electrode terminals H–H' for an input signal are constructed. On the other hand, electrodes 231, 232, 233 which are of the same electrical polarity are disposed on the side surfaces and inside the grooves 225, 237 such that an electrode terminal I is defined, while electrodes 234, 235, 236 which are of the same electrical polarity are disposed on the side surfaces and inside the grooves 225, 237 such that an electrode terminal I' of opposite electrical polarity to the electrode terminal I is defined. Namely, two electrode terminals I–I' for an output signal are constructed. The resonator of this embodiment is made of quartz crystal, but may be made of a piezoelectric material such as lithium tantalite, lithium niobate and ceramics.

FIG. 16(a) and FIG. 16(b) show a plan view and a J–J' sectional view of a quartz crystal resonator 230 of an eighth embodiment of the present invention, and which is a quartz crystal tuning fork resonator. The resonator 230 comprises vibrational arms 231 and 232 and a base portion 233 attached to the vibrational arms. In addition, each of the vibrational arms 231 and 232 has a first main surface and a second main surface opposite the first main surface and side surfaces, and the first and second main surfaces have central linear portions 242, 243, respectively. The vibrational arm 231 has grooves 234, 235 and the vibrational arm 232 has grooves 235, 237. In addition, the grooves 234 and 236 are formed between the central linear portion 242 and an outer edge of the vibrational arm 231, respectively. Similar to this, the grooves 235 and 237 are formed between the central linear portion 243 and an outer edge of the vibrational arm 232, respectively.

Moreover, each of the grooves 234, 235, 236 and 237 has a width $W_8$, and a width $W_7$ including a portion of the central linear lines 242 and 243 is formed in each of the vibrational arms 231 and 232. In addition, a distance $W_9$ is formed in the width direction of the vibrational arms 231 and 232 between an outer edge of the groove and an outer edge of the vibrational arms. In detail, a width W of the arms 231 and 232 has generally a relationship of $W=W_7+2W_8+2W_9$, and the width $W_8$ is constructed so that $W_8 \geq W_7$, $W_9$. In this embodiment, also, the grooves are constructed at the arms so that a ratio $W_8/(W/2)$ of the width $W_8$ and a half width of the width W is greater than 0.35 and less than 1, preferably, within a range of 0.35 to 0.95. In addition, the width $W_7$ is less than 0.05 mm, preferably, less than 0.03 mm and the width $W_8$ is within a range of 0.015 mm to 0.05 mm to obtain a very large moment of inertia of the vibrational arms. That is, the quartz crystal tuning fork resonator, capable of vibrating in a fundamental mode, and having a frequency of high stability can be provided with a small series resistance $R_1$, a high quality factor $Q_1$ and a small capacitance ratio $r_1$ because it has a very large electromechanical transformation efficiency.

In FIG. 16(b), the vibrational arm 231 has grooves 234, 236, 238 and 240 cut into it. The grooves 234, 236, 238 and 240 have a first set of electrodes 256, 257, 258 and 259 of the same electrical polarity, while the side surfaces of the arm 231 have a second set of electrodes 244 and 245 having an opposite electrical polarity to the first set of electrodes 256, 257, 258 and 259. The vibrational arm 232 has grooves 235, 237, 239 and 241 constructed in a similar manner as the vibrational arm 231. The grooves 235, 237, 239 and 241 have a third set of electrodes 252, 253, 254 and 255 of the same electrical polarity, and the side surfaces of the vibrational arm 232 have a fourth set of electrodes 250 and 251 with the opposite electrical polarity to the third electrodes 252, 253, 254 and 255. The electrodes disposed on the vibrational arms 231 and 232 are connected as shown in FIG. 16(b), namely, two electrode terminals of different electrical polarity K–K' are obtained.

In detail, the first set of electrodes 256, 257, 258 and 259 disposed on the grooves 234, 236, 238 and 240 of the vibrational arm 231 have the same electrical polarity as the fourth set of electrodes 250 and 251 disposed on both side surfaces of the vibrational arm 232, while the second set of electrodes 244 and 245 disposed on both side surfaces of the vibrational arm 231 have the same electrical polarity as the third set of electrodes 252, 253, 254 and 255 disposed on the grooves 235, 237, 239 and 241 of the arm 232. When a direct current voltage is applied between the electrode terminals K–K', an electric field Ex occurs along the arrow direction inside the vibrational arms 231 and 232. As the electric field Ex occurs perpendicular to the electrodes disposed on the vibrational arms, as shown in the arrow signs, the electric field Ex has a very large value and a large distortion occurs at the vibrational arms. As a result, a quartz crystal tuning fork resonator capable of vibrating in a flexural mode is obtained with a small series resistance $R_1$ and a high quality factor Q because even when miniaturized there is a very large electromechanical transformation efficiency for the resonator.

Figure 17:
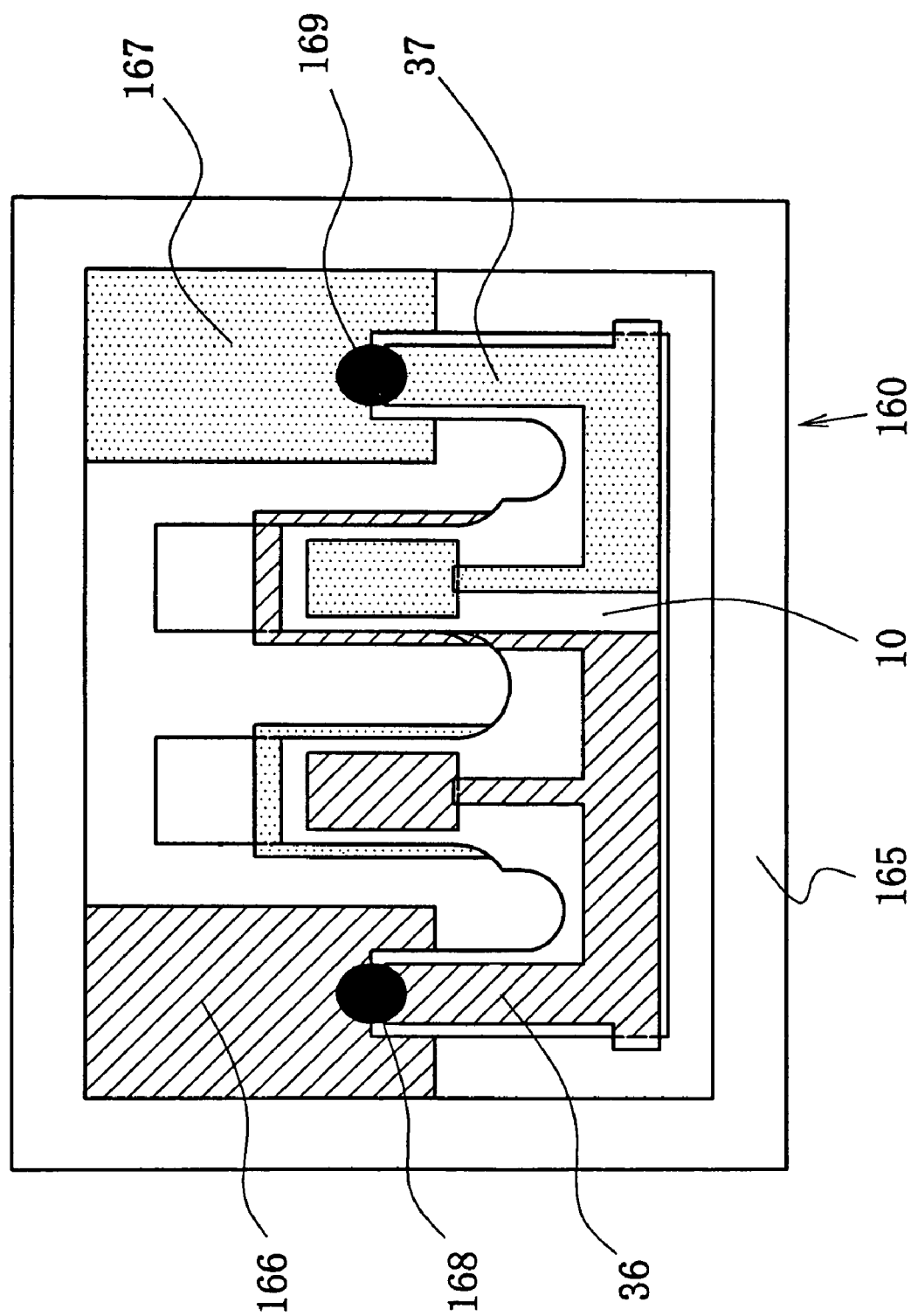
FIG. 17 shows a plan view of a quartz crystal unit of a first embodiment of the present invention and omitting a lid.

FIG. 17 shows a plan view of a quartz crystal unit of a first embodiment of the present invention and omitting a lid. The quartz crystal unit 160 comprises the quartz crystal tuning fork resonator 10 shown in FIG. 2, a case 165 for housing the resonator and a lid for covering an open end of the case (not shown here). Also, the resonator 10 has mounting arms 36 and 37, each of which is mounted on a mounting portion 166 and a mounting portion 167 of the case 165. In detail, an electrode disposed on the mounting arm 36 is connected to an electrode disposed on the mounting portion 166 by adhesives 168 or a metal such as solder, and similarly, an electrode disposed on the mounting arm 37 is connected to an electrode disposed on the mounting portion 167 by adhesives 169 or a metal.

Figure 18:
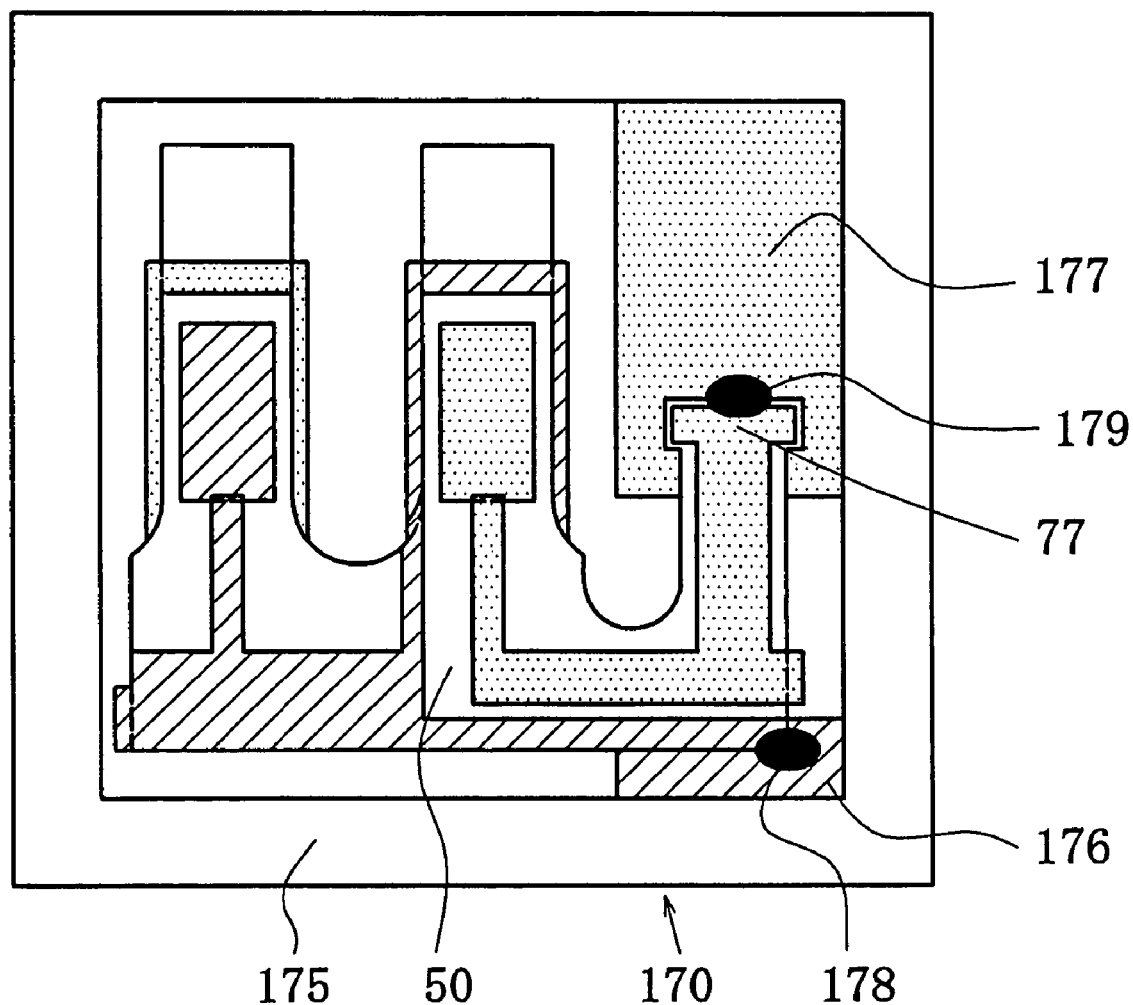
FIG. 18 shows a plan view of a quartz crystal unit of a second embodiment of the present invention and omitting a lid.

FIG. 18 shows a plan view of a quartz crystal unit of a second embodiment of the present invention and omitting a lid. The quartz crystal unit 170 comprises the quartz crystal tuning fork resonator 50 shown in FIG. 5, a case 175 for housing the resonator and a lid for covering an open end of the case (not shown here). Namely, the resonator comprises vibrational arms and a base portion. Also, the case 175 has mounting portions 176 and 177 and the resonator 50 has a mounting arm 77 protruding from the base portion, which is mounted on the mounting portion 177 of the case 175. In detail, an electrode disposed on the mounting arm 77 is connected to an electrode disposed on the mounting portion 177 by adhesives 179 or a metal such as solder, and similarly, an electrode disposed on the base portion of the resonator 50 is connected to an electrode disposed on the mounting portion 176 by adhesives 178 or a metal such as solder.

Figure 19:
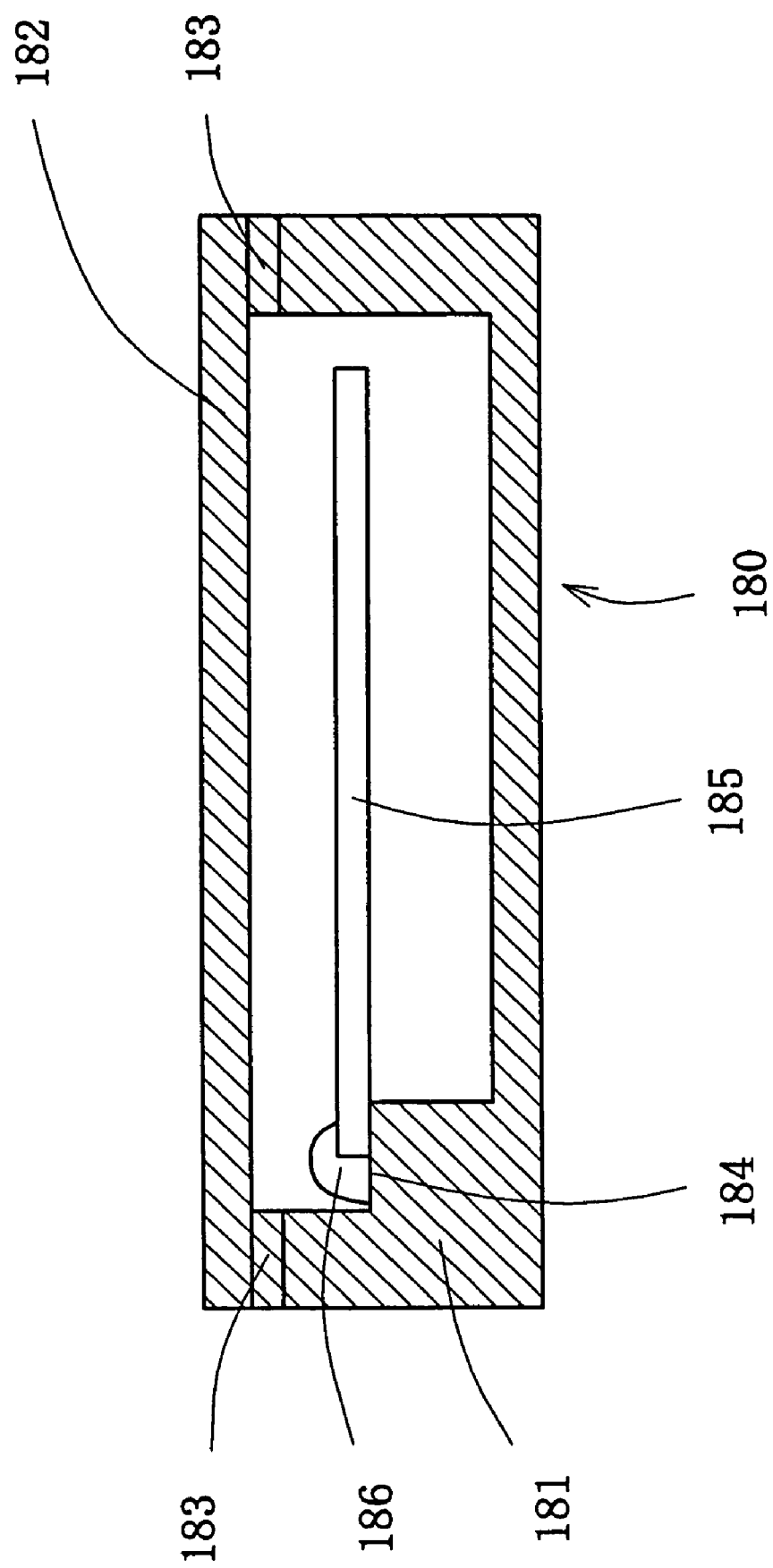
FIG. 19 shows a cross-sectional view of a quartz crystal unit of a third embodiment of the present invention.

FIG. 19 shows a cross-sectional view of a quartz crystal unit of a third embodiment of the present invention. The quartz crystal unit 180 comprises a contour mode quartz crystal resonator 185 or a thickness shear mode quartz crystal resonator 185, a case 181 and a lid 182. In more detail, the resonator 185 is mounted on a mounting portion 184 of the case 181 by conductive adhesives 76 or solder. Also, the case 181 and the lid 182 are connected through a connecting member 183. For example, the contour mode resonator 185 in this embodiment is the same resonator as one of the quartz crystal tuning fork resonators 10, 50, 90, 110, 120, 130, 140, 220 and 230 described in detail in FIG. 2–FIG. 11 and FIG. 15–FIG. 16.

In this embodiment, circuit elements are connected at outside of the quartz crystal unit to get a quartz crystal oscillator. Namely, only the quartz crystal tuning fork resonator is housed in the unit and also, it is housed in the unit in vacuum. In this embodiment, the quartz crystal unit of a surface mounting type is shown, but the quartz crystal tuning fork resonator may be housed in a tubular type, namely, a quartz crystal unit of the tubular type. In addition, the quartz crystal unit of the present invention includes any shape of a quartz crystal unit comprising a quartz crystal resonator, a case and a lid to house the quartz crystal resonator in vacuum.

Also, instead of the quartz crystal tuning fork resonator and the thickness shear mode quartz crystal resonator, one of a length-extensional mode quartz crystal resonator, a width-extensional mode quartz crystal resonator and a Lame mode quartz crystal resonator which are a contour mode quartz crystal resonator, respectively, or a SAW (Surface Acoustic Wave) resonator or a piezoelectric resonator for sensing angular velocity (angular velocity sensor) made of quartz crystal or ceramics may be housed in the unit.

In addition, a member of the case and the lid is ceramics or glass and a metal or glass, respectively, and a connecting member is a metal or glass with low melting point. Also, a relationship of the resonator, the case and the lid described in this embodiment is applied to a quartz crystal oscillator of the present invention which will be described in FIG. 20.

Figure 20:
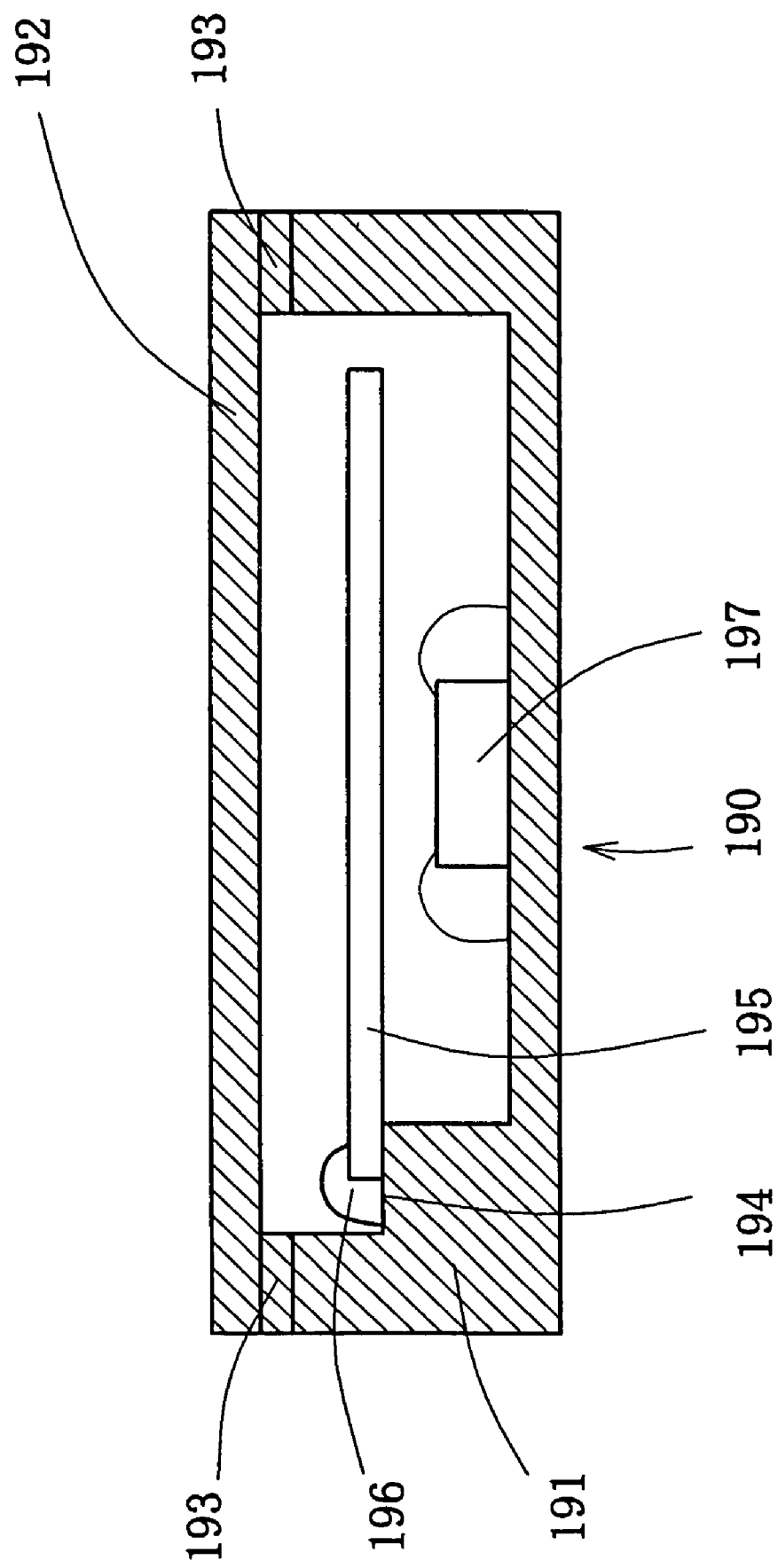
FIG. 20 shows a cross-sectional view of a quartz crystal oscillator of a first embodiment of the present invention.

FIG. 20 shows a cross-sectional view of a quartz crystal oscillator of a first embodiment of the present invention. The quartz crystal oscillator 190 comprises a quartz crystal oscillating circuit, a case 191 and a lid 192. In this embodiment, circuit elements constructing the oscillating circuit are housed in a quartz crystal unit comprising a contour mode quartz crystal resonator 195 or a thickness shear mode quartz crystal resonator 195, the case 191 and the lid 192. Also, the oscillating circuit of this embodiment comprises an amplifier 197 including a feedback resistor, the resonator 195, a plurality of capacitors (not shown here) and a drain resistor (not shown here), and a CMOS inverter is used as the amplifier 197.

In addition, in this embodiment, the resonator 195 is mounted on a mounting portion 194 of the case 191 by conductive adhesives 196 or solder. As described above, the amplifier 197 is housed in the quartz crystal unit and mounted on the case 191. Also, the case 191 and the lid 192 are connected through a connecting member 193.

Figure 21:
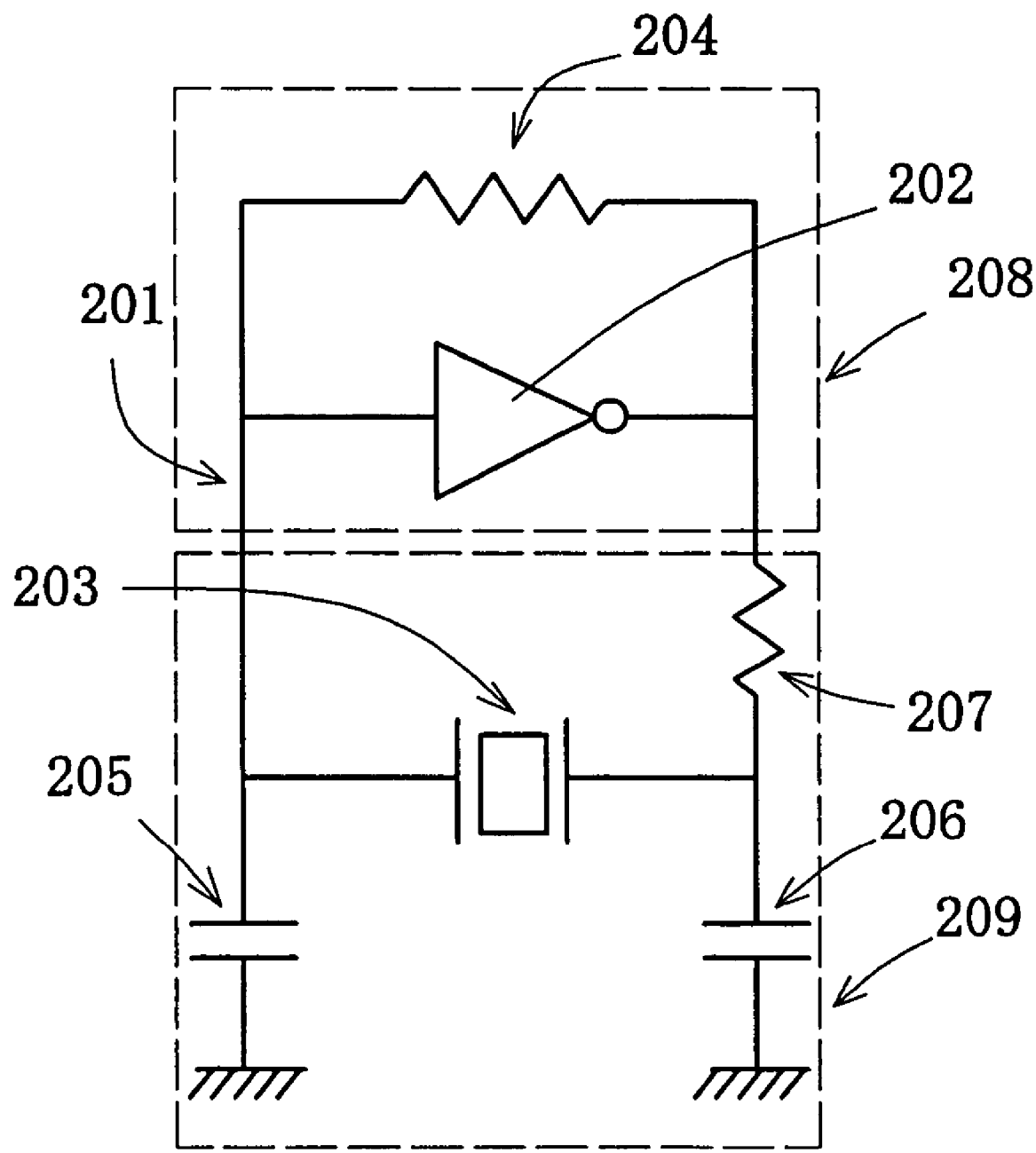
FIG. 21 shows a diagram of an embodiment of a quartz crystal oscillating circuit constructing a quartz crystal oscillator of the present invention.

FIG. 21 shows a diagram of an embodiment of a quartz crystal oscillating circuit constructing a quartz crystal oscillator of the present invention. The quartz crystal oscillating circuit 201 comprises an amplifier (CMOS inverter) 202, a feedback resistor 204, a drain resistor 207, a plurality of capacitors 205, 206 and a quartz crystal resonator 203. Namely, the oscillating circuit 201 comprises an amplification circuit 208 having the amplifier 202 and the feedback resistor 204, and a feedback circuit 209 having the drain resistor 207, the capacitors 205, 206 and the quartz crystal resonator 203. The quartz crystal resonator 203 is one of the resonators already described above. For example, when the resonator 203 is a quartz crystal tuning fork resonator capable of vibrating in a flexural mod, an output signal of the oscillating circuit 201 is outputted through a buffer circuit (not shown in FIG. 21), and is an oscillating frequency of a fundamental mode of vibration of the resonator.

In other words, the oscillation frequency of the fundamental mode of vibration of the quartz crystal tuning fork resonator is outputted from the oscillating circuit through the buffer circuit as an output signal. According to the present invention, a nominal frequency of the fundamental mode of vibration of the quartz crystal tuning fork resonator is within a range of 10 kHz to 200 kHz. Especially, a frequency of 32.768 kHz is very available for use in an electronic apparatus of the present invention. In general, the output signal has an oscillation frequency which is within a range of −100 PPM to +100 PPM to the nominal frequency, e.g. 32.768 kHz.

In more detail, the quartz crystal oscillator in this example comprises a quartz crystal oscillating circuit and a buffer circuit, namely, the quartz crystal oscillating circuit comprises an amplification circuit and a feedback circuit, and the amplification circuit comprises an amplifier (CMOS inverter) and a feedback resistor and the feedback circuit comprises a quartz crystal tuning fork resonator capable of vibrating in a flexural mode, a drain resistor and a plurality of capacitors. Also, the quartz crystal tuning fork resonator already described in FIG. 2–FIG. 11 and FIG. 15–FIG. 16 is used in a quartz crystal oscillator of the present invention. Instead of the quartz crystal tuning fork resonator, an another contour mode quartz crystal resonator such as a length-extensional mode quartz crystal resonator, a width-extensional mode quartz crystal resonator and a Lame mode quartz crystal resonator or a thickness shear mode quartz crystal resonator or a resonator for sensing angular velocity may be used.

Figure 22:
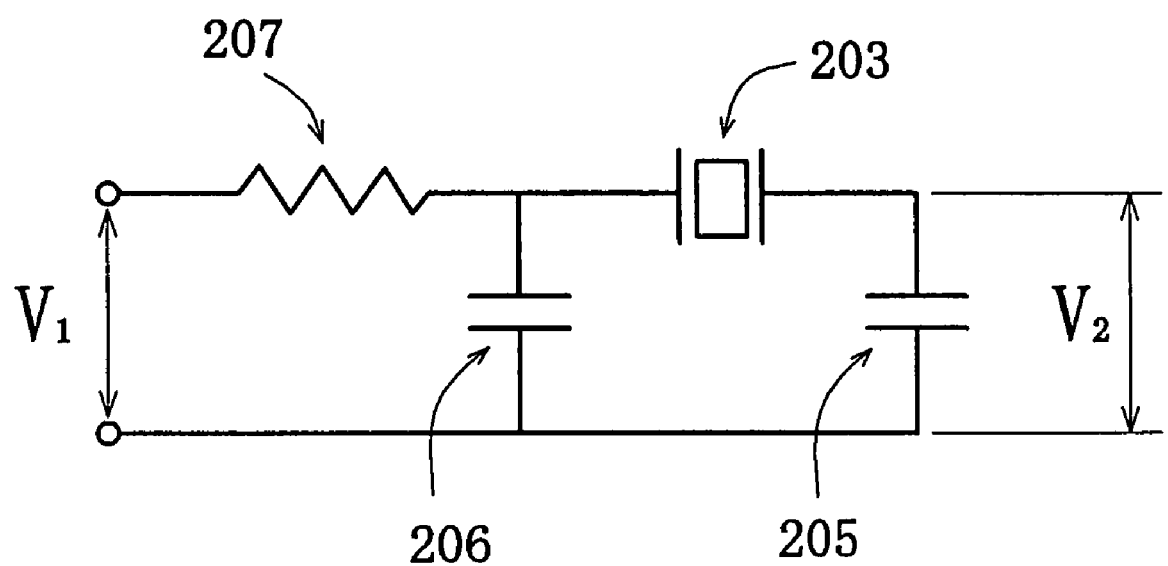
FIG. 22 shows a diagram of the feedback circuit of FIG. 21.

FIG. 22 shows a diagram of the feedback circuit of FIG. 21. In this embodiment, the feedback circuit has a quartz crystal tuning fork resonator capable of vibrating in a flexural mode. Now, when angular frequency $\omega_i$ of the quartz crystal tuning fork resonator 203, a resistance value $R_d$ of the drain resistor 207, capacitance values $C_g$, $C_d$ of the capacitors 205, 206, crystal impedance $R_{ei}$ of the quartz crystal resonator 203, an input voltage $V_1$, and an output voltage $V_2$ are taken, a feedback rate $\beta_i$ is defined by $\beta_i = |V_2|_i/|V_1|_i$, where i shows a vibration order, for example, when i=1 and 2, $\beta_1$ and $\beta_2$ are a feedback rate for a fundamental mode of vibration and a second overtone mode of vibration of the resonator, respectively.

In addition, load capacitance $C_L$ is given by $C_L = C_g C_d/(C_g + C_d)$, and when $C_g = C_d = C_{gd}$ and $R_d \gg R_{ei}$, the feedback rate $\beta_i$ is given by $\beta_i = 1/(1 + k C_L^2)$, where k is expressed by a function of $\omega_i$, $R_d$ and $R_{ei}$. Also, $R_{ei}$ is approximately equal to series resistance $R_i$ of the resonator.

Thus, it is easily understood from a relationship of the feedback rate $\beta_i$ and load capacitance $C_L$ that the feedback rate of a resonance frequency for the fundamental mode of vibration and the overtone mode vibration becomes large, respectively, according to decrease of load capacitance $C_L$. Therefore, when $C_L$ has a small value, an oscillation of the overtone mode occurs very easily, instead of that of the fundamental mode. This is the reason why maximum amplitude of the overtone mode of vibration becomes smaller than that of the fundamental mode of vibration, and the oscillation of the overtone mode satisfies an amplitude condition and a phase condition simultaneously which are the continuous condition of an oscillation in an oscillating circuit.

As it is also one object of the present invention to provide a quartz crystal oscillator having a flexural mode, quartz crystal tuning fork resonator, capable of vibrating in a fundamental mode and having a frequency of high stability (high time accuracy) of an output signal, and having reduced electric current consumption, load capacitance $C_L$ is less than 25 pF in this embodiment to reduce electric current consumption. To get much reduced electric current consumption, $C_L$ is preferably less than 15 pF because the electric current consumption is proportional to $C_L$.

In addition, in order to suppress a second overtone mode of vibration of the resonator and to obtain a quartz crystal oscillator having an output signal of an oscillation frequency of a fundamental mode of vibration of the resonator, the quartz crystal oscillator comprising an amplification circuit and a feedback circuit is constructed so that it satisfies a relationship of $\alpha_1/\alpha_2 > \beta_2/\beta_1$ and $\alpha_1 \beta_1 > 1$, where $\alpha_1$ and $\alpha_2$ are, respectively, an amplification rate of the fundamental mode of vibration and the second overtone mode of vibration of the amplification circuit, and $\beta_1$ and $\beta_2$ are, respectively, a feedback rate of the fundamental mode of vibration and the second overtone mode of vibration of the feedback circuit.

In other words, the quartz crystal oscillator is constructed so that a ratio of the amplification rate $\alpha_1$ of the fundamental mode of vibration and the amplification rate $\alpha_2$ of the second overtone mode of vibration of the amplification circuit is greater than that of the feedback rate $\beta_2$ of the second overtone mode of vibration and the feedback rate $\beta_1$ of the fundamental mode vibration of the feedback circuit, and also a product of the amplification rate $\alpha_1$ and the feedback rate $\beta_1$ of the fundamental mode of vibration is greater than 1. A description of a frequency of high stability in the quartz crystal oscillator will be performed later.

Also, characteristics of the amplifier of the amplification circuit constructing the quartz crystal oscillating circuit of this embodiment can be expressed by negative resistance $-RL_i$. For example, when i=1, negative resistance $-RL_1$ is for a fundamental mode of vibration of the resonator and when i=2, negative resistance $-RL_2$ is for a second overtone mode of vibration of the resonator. In this embodiment, the quartz crystal oscillating circuit is constructed so that a ratio of an absolute value of negative resistance $-RL_1$ of the fundamental mode of vibration of the amplification circuit and series resistance $R_1$ of the fundamental mode of vibration is greater than that of an absolute value of negative resistance $-RL_2$ of the second overtone mode of vibration of the amplification circuit and series resistance $R_2$ of the second overtone mode of vibration.

That is, the oscillating circuit is constructed so that it satisfies a relationship of $|-RL_1|/R_1 > |-RL_2|/R_2$. By constructing the oscillating circuit like this, an oscillation of the second overtone mode can be suppressed, as a result of which a frequency of oscillation of the fundamental mode of vibration can be output as an output signal because the oscillation of the fundamental mode generates easily in the oscillating circuit. In more detail, an absolute value of the negative resistance $-RL_1$ is within a range of 60 k$\Omega$ to 285 k$\Omega$, and an absolute value of the negative resistance $-RL_2$ is less than 105 k$\Omega$ to suppress the frequency of oscillation of the second overtone mode of the quartz crystal tuning fork resonator in the oscillating circuit and to obtain the frequency of oscillation of the fundamental mode thereof.

In this embodiment, a quartz crystal tuning fork resonator is used, but, instead of the tuning fork resonator, an another contour mode quartz crystal resonator such as a width-extensional mode quartz crystal resonator, a length-extensional mode quartz crystal resonator and a Lame mode quartz crystal resonator may be used in a quartz crystal oscillator of the present invention. In this case, a principal vibration of the contour mode quartz crystal resonator is outputted from an oscillating circuit constructing the quartz crystal oscillator through a buffer circuit. In order to suppress a sub-vibration of the contour mode quartz crystal resonator, the quartz crystal oscillator comprising an amplification circuit and a feedback circuit is constructed so that it satisfies a relationship of $\alpha_p/\alpha_s > \beta_s/\beta_p$ and $\alpha_p\beta_p > 1$, where $\alpha_p$ and $\alpha_s$ are, respectively, an amplification rate of the principal vibration and the sub-vibration of the amplification circuit, and $\beta_p$ and $\beta_s$ are, respectively, a feedback rate of the principal vibration and the sub-vibration of the feedback circuit.

Similar to the quartz crystal tuning fork resonator, for the contour mode quartz crystal resonator, a quartz crystal oscillating circuit of the present invention is constructed so that a ratio of an absolute value of negative resistance $-RL_p$ of the principal vibration of the amplification circuit and a series resistance $R_p$ of the principal vibration is greater than that of an absolute value of negative resistance $-RL_s$ of the sub-vibration of the amplification circuit and a series resistance $R_s$ of the sub-vibration. That is, the oscillating circuit is constructed so that it satisfies a relationship of $|-RL_p|/R_p > |-RL_s|/R_s$. By constructing the oscillating circuit like this, an oscillation of the sub-vibration can be suppressed, as a result of which a frequency of oscillation of the principal vibration can be outputted as an output signal because the oscillation of the principal vibration generates easily in the oscillating circuit. In addition, the principal vibration and the sub-vibration have the same mode of vibration and a different order of vibration each other.

Figure 23:
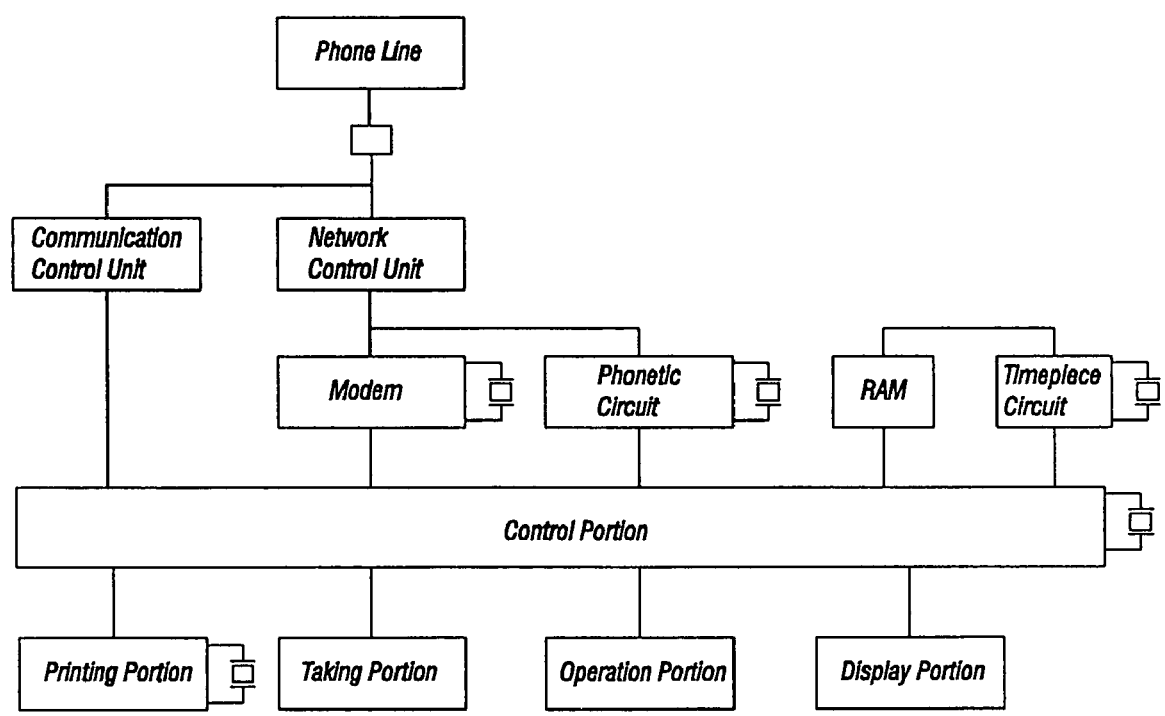
FIG. 23 shows a block diagram of an embodiment of an electronic apparatus of the present invention.

FIG. 23 shows a block diagram of an embodiment of an electronic apparatus of the present invention, and illustrating the diagram of a facsimile apparatus. As shown in FIG. 23, the apparatus generally comprises a modem, a phonetic circuit, a timepiece circuit, a printing portion, a taking portion, an operation portion and a display portion. In this principle, perception and scanning of reflection light of light projected on manuscript in the taking portion are performed by CCD(Charge Coupled Device), in addition, light and shade of the reflection light are transformed into a digital signal, and the signal is modulated by the modem and is sent to a phone line(communication line). Also, in a receiving side, a received signal is demodulated by the modem and is printed on a paper in the print portion by synchronizing the received signal with a signal of a sending side.

In FIG. 23, a quartz crystal resonator is used as a CPU clock of the control portion and the printing portion, as a clock of the phonetic circuit and the modem, and as a time standard of the timepiece. Namely, the resonator constructs a quartz crystal oscillator and an output signal of the oscillator is used. Like this, a plurality of oscillators is used for the electronic apparatus. For example, it is used as a signal to display time at the display portion. In this case, a quartz crystal tuning fork resonator, capable of vibrating in a flexural mode is generally used, and e.g. as the CPU clock, a contour mode quartz crystal resonator such as a length-extensional mode quartz crystal resonator, a width-extensional mode quartz crystal resonator and a Lame mode quartz crystal resonator or a thickness shear mode quartz crystal resonator is used. To get the facsimile apparatus of this embodiment which operates normally, an accuracy signal of output of the oscillator is required for the facsimile apparatus, which is one of the electronic apparatus of the present invention. Also, a digital display and an analogue display are included in the display of the present invention.

In this embodiment, though the facsimile apparatus is shown as an example of an electronic apparatus of the present invention, the present invention is not limited to this, namely, the present invention includes all electronic apparatus, each of which comprises a quartz crystal oscillator and a display portion at least, for example, cellar phones, telephones, a TV set, cameras, a video set, video cameras, pagers, personal computers, printers, CD players, MD players, electronic musical instruments, car navigators, car electronics, timepieces, IC cards and so forth. In addition, the electronic apparatus may have an another oscillator comprising a piezoelectric resonator for sensing angular velocity made of quartz crystal, ceramics, lithium tantalite and lithium niobate.

Thus, the electronic apparatus of the present invention comprising a display portion and a quartz crystal oscillator at least may operate normally because the quartz crystal oscillator comprises the quartz crystal oscillating circuit with a frequency of high stability, namely, a frequency of high reliability.

Moreover, capacitance ratios $r_1$ and $r_2$ of a flexural mode, quartz crystal tuning fork resonator are given by $r_1 = C_0/C_1$ and $r_2 = C_0/C_2$, respectively, where $C_0$ is shunt capacitance in an electrical equivalent circuit of the resonator, and $C_1$ and $C_2$ are, respectively, motional capacitance of a fundamental mode of vibration and a second overtone mode of vibration in the electrical equivalent circuit of the resonator. In addition, the resonator has a quality factor $Q_1$ for the fundamental mode of vibration and a quality factor $Q_2$ for the second overtone mode of vibration.

In detail, the tuning fork resonator of this embodiment is provided so that the influence on resonance frequency of the fundamental mode of vibration by the shunt capacitance becomes smaller than that of the second overtone mode of vibration by the shunt capacitance, namely, so that it satisfies a relationship of $S_1 = r_1/2Q_1^2 < S_2 = r_2/2Q_2^2$, preferably, $S_1 < S_2/2$, where $S_1$ and $S_2$ are called "a stable factor of frequency" of the fundamental mode of vibration and the second overtone mode of vibration. As a result, the tuning fork resonator, capable of vibrating in the fundamental mode and having a frequency of high stability can be provided because the influence on the resonance frequency of the fundamental mode of vibration by the shunt capacitance $C_0$ is as extremely small as it can be ignored. In this embodiment $S_2$ has a value greater than $0.13 \times 10^{-6}$ to suppress the second overtone mode of vibration of the resonator.

In addition, as described above, it will be easily understood that the quartz crystal resonator comprising vibrational arms and a base portion, according to the present invention, may have outstanding effects. Similar to this, the quartz crystal unit and the quartz crystal oscillator, according to the present invention, may have also outstanding effects. In addition, the electronic apparatus comprising the quartz crystal oscillator comprising the quartz crystal oscillating circuit having the quartz crystal tuning fork resonator, capable of vibrating in a flexural mode, and having novel shapes, novel electrode construction and excellent electrical characteristics, according to the present invention, may have the outstanding effects. Similar to this, it will be easily understood that the electronic apparatus comprising the quartz crystal oscillator comprising the quartz crystal oscillating circuit having the another contour mode quartz crystal resonator or the thickness shear mode quartz crystal resonator or the resonator for sensing angular velocity, according to the present invention, may have also the outstanding effect. In addition to this, while the present invention has been shown and described with reference to preferred embodiments thereof, it will be understood by those skilled in the art that the changes in shape and electrode construction can be made therein without departing from the spirit and scope of the present invention.

What is claimed is:

1. A quartz crystal resonator comprising: a base portion and a plurality of vibrational arms connected to the base portion; wherein the quartz crystal resonator has a piezoelectric constant $e'_{12}$ in the range of 0.1 C/m² to 0.19 C/m² in the absolute value.

2. A quartz crystal resonator according to claim 1; wherein the resonator according to claim 1; wherein the quartz crystal resonator has a cutting angle in the range of ZYlwt (−20° to +20°)/(−25° to +25°)/(−18° to +18°).

3. A quartz crystal resonator according to claim 1; wherein the vibrational arms have a first vibrational arm and a second vibrational arm; each of the first and second vibrational arms having a first main surface and a second main surface opposite the first main surface; wherein at least one groove is formed in each of the first and second main surfaces of each of the first second vibrational arms; wherein a length of at least one of the grooves formed in the first and second main surfaces of each of the first and second vibrational arms is within a range of 30% to 80% of a length of each of the first and second vibrational arms and is within a range of 0.45mm to 1.25mm; and wherein an electrode is disposed in the at least one groove formed in each of the first and second main surfaces of each of the first and second vibrational arms so that a capacitance ratio r1 of a fundamental mode of vibration of the quartz crystal resonator is less than a capacitance ratio $r_2$ of a second overtone mode of vibration thereof.

4. A quartz crystal resonator according to claim 1; wherein the quartz crystal resonator comprises a quartz crystal tuning fork resonator having a tuning fork base and first and second tuning fork arms connected to the tuning fork base, each of the first and second tuning fork arms having a first main surface and a second main surface opposite the first main surface; wherein at least one groove is formed in each of the first and second main surfaces of each of the first and second tuning fork arms; wherein a length of the tuning fork base is within a range of 0.015mm to 0.49mm and an overall length of the quartz crystal tuning fork resonator having the tuning fork base and the first and second tuning fork arms connected to the tuning fork base is within a range of 1.02mm to 1.95mm; and wherein an electrode is disposed in the at least one groove formed in each of the first and second main surfaces of each of the first and second vibrational arms so that a capacitance ratio r1 of a fundamental mode of vibration of the quartz crystal resonator is less than a capacitance ratio r2 of a second overtone mode of vibration thereof.

5. A quartz crystal resonator according to claim 1; wherein the quartz crystal resonator comprises a quartz crystal tuning fork resonator having a tuning fork base and a plurality of tuning fork arms connected to the tuning fork base; wherein the tuning fork arms have a first tuning fork arm and a second tuning fork arm, each of the first and second tuning fork arms having a first main surface and a second main surface opposite the first main surface; wherein at least one groove is formed in each of the first and second main surfaces of each of the first and second tuning fork arms; and wherein at least one mounting arm is connected to the tuning fork base through a connecting portion so that a length of the at least one mounting arm is within a range of 0.3 mm to 1.85 mm.

6. A quartz crystal unit comprising: a quartz crystal resonator, capable of vibrating in a flexural mode of an inverse phase and having a base portion and a plurality of vibrational arms connected to the base portion; a case for housing the quartz crystal resonator; and a lid for covering an open end of the case; wherein the quartz crystal resonator has a cutting angle in the range of ZYlwt (−20°. to 20°.)/(−25°. to 25°.)/(−18°. to −18°.) and a piezoelectric constant $e'_{12}$ of the quartz crystal resonator is within a range of 0.1 C/m² to 0.19 C/m² in the absolute value.

7. A quartz crystal unit according to claim 6; wherein the vibrational arms have a first vibrational arm and a second vibrational arm, each of the first and second vibrational arms having a first main surface and a second main surface opposite the first main surface; and wherein at least one groove is formed in at least one of the first and second main surfaces of each of the first and second vibrational arms.

8. A quartz crystal unit according to claim 7; wherein the at least one groove formed in at least one of the first and second main surfaces of each of the first and second vibrational arms comprises a plurality of grooves having a first groove and a second groove in at least one of the first and second main surfaces of each of the first and second vibrational arms; wherein the first and second grooves are formed in the width direction of the corresponding one of the first and second vibrational arms; wherein a width of the first groove formed in at least one of the first and second main surfaces of each of the first and second vibrational arms is greater than or equal to a distance in the width direction of the first groove measured from an outer edge of the first groove to an outer edge of the corresponding one of the first and second vibrational arms; and wherein a width of the second groove formed in at least one of the first and second main surfaces of each of the first and second vibrational arms is greater than or equal to a distance in the width direction of the second groove measured from an outer edge of the second groove to an outer edge of the corresponding one of the first and second vibrational arms.

9. A quartz crystal unit according to claim 7; wherein the at least one groove formed in at least one of the first and second main surfaces of each of the first and second vibrational arms comprises a plurality of grooves having a first groove and a second groove in at least one of the first and second main surfaces of each of the first and second vibrational arms; wherein the first and second grooves are formed in the width direction of the corresponding one of the first and second vibrational arms; and wherein a width of at least one of the first and second grooves is greater than or equal to a distance in the width direction of the first and second grooves measured from an outer edge of the first groove to an outer edge of the second groove.

10. A quartz crystal unit according to claim 9; wherein the distance in the width direction of the first and second grooves measured from the outer edge of the first groove to the outer edge of the second groove is less than 0.05 mm.

11. A quartz crystal unit according to claim 7; wherein the at least one groove formed in at least one of the first and second main surfaces of each of the first and second vibrational arms comprises a plurality of grooves having a first groove and a second groove in at least one of the first and second main surfaces of each of the first and second vibrational arms; and wherein the first and second grooves are formed in the width direction of the corresponding one of the first and second vibrational arms so that a width of at least one of the first and second grooves is within a range of 0.015 mm to 0.05 mm.

12. A quartz crystal unit according to claim 7; wherein the at least one groove formed in at least one of the first and second main surfaces of each of the first and second vibrational arms comprises a plurality of grooves having a first groove and a second groove in at least one of the first and second main surfaces of each of the first and second vibrational arms; wherein the first and second grooves are formed in the width direction of the corresponding one of the first and second vibrational arms; wherein each of the first and second vibrational arms has a central linear portion, a first outer edge and a second outer edge opposite the first outer edge; wherein the first groove is formed between the central linear portion and the first outer edge and the second groove is formed between the central linear portion and the second outer edge; and wherein an electrode is disposed in each of the first and second grooves in each of the first and second main surfaces of each of the first and second vibrational arms so that a series resistance $R_1$ of a fundamental mode of vibration of the quartz crystal resonator is less than a series resistance of a second overtone mode of vibration thereof and a capacitance ratio $r_1$ of the fundamental mode of vibration of the quartz crystal resonator is less than a capacitance ratio $r_2$ of the second overtone mode of vibration thereof.

13. A quartz crystal unit according to claim 7; wherein a mounting arm protrudes from the base portion; and wherein the mounting arm is mounted on a mounting portion of the case for housing the quartz crystal resonator.

14. A quartz crystal unit according to claim 13; wherein the quartz crystal resonator comprises a quartz crystal tuning fork resonator, capable of vibrating in a flexural mode and having a quartz crystal tuning fork base, first and second quartz crystal tuning fork arms connected to the quartz crystal tuning fork base and at least one groove formed in each of opposite main surfaces of each of the first and second quartz crystal tuning fork arms; wherein a mounting arm protrudes from the quartz crystal tuning fork base and is formed between the first and second quartz crystal tuning fork arms; and wherein the mounting arm is mounted on a mounting portion of a case for housing the quartz crystal tuning fork resonator.

15. A quartz crystal unit according to claim 13; wherein the quartz crystal resonator comprises a quartz crystal tuning fork resonator, capable of vibrating in a flexural mode and having a quartz crystal tuning fork base, first and second quartz crystal tuning fork arms connected to the quartz crystal tuning fork base and at least one groove formed in each of opposite main surfaces of each of the first and second quartz crystal tuning fork arms; wherein a mounting arm protrudes from the quartz crystal tuning fork base so that the mounting arm extends in a common direction with the first and second quartz crystal tuning fork arms outside the first and second quartz crystal tuning fork arms; and wherein the mounting arm is mounted on a mounting portion of a case for housing the quartz crystal tuning fork resonator.

16. A quartz crystal unit according to claim 6; wherein the quartz crystal resonator comprises a quartz crystal tuning fork resonator having a tuning fork base and first and second tuning fork arms connected to the tuning fork base, each of the first and second tuning fork arms having a first main surface and a second main surface opposite the first main surface; wherein at least one groove is formed in each of the first and second main surfaces of each of the first and second tuning fork arms; wherein at least one mounting arm is connected to the tuning fork base through a connecting portion and is mounted on a mounting portion of a case for housing the quartz crystal tuning fork resonator; wherein a length of the tuning fork base is less than 0.5 mm and an overall length of the quartz crystal tuning fork resonator having the tuning fork base and the first and second tuning fork arms connected to the tuning fork base is within a range of 1.02 mm to 1.95 mm; and wherein an electrode is disposed in the at least one groove formed in each of the first and second main surfaces of each of the first and second tuning fork arms so that a capacitance ratio $r_1$ of a fundamental mode of vibration of the quartz crystal tuning fork resonator is less than a capacitance ratio r2 of a second overtone mode of vibration thereof.

17. A quartz crystal unit according to claim 6; wherein the quartz crystal resonator comprises a quartz crystal tuning fork resonator, capable of vibrating in a flexural mode and having a quartz crystal tuning fork base, first and second quartz crystal tuning fork arms connected to the quartz crystal tuning fork base and a groove formed in each of opposite main surfaces of each of the first and second quartz crystal tuning fork arms; wherein each of the first and second quartz crystal tuning fork arms has a plurality of different widths having a first width and a second width greater than the first width; and wherein the groove formed in each of the opposite main surfaces of each of the first and second quartz crystal tuning fork arms is formed in at least one of the first and second width directions of the corresponding one of the first and second quartz crystal tuning fork arms.

18. A quartz crystal unit according to claim 17; wherein at least one mounting arm is connected to the quartz crystal tuning fork base through a connecting portion; and wherein the at least one mounting arm is mounted on a mounting portion of a case for housing the quartz crystal tuning fork resonator.

19. A quartz crystal unit according to claim 17; wherein the groove formed in each of the opposite main surfaces of each of the first and second quartz crystal tuning fork arms is formed in the first width direction of the corresponding one of the first and second quartz crystal tuning fork arms.

20. A quartz crystal unit according to claim 6; wherein the quartz crystal resonator comprises a quartz crystal tuning fork resonator having a tuning fork base and first and second tuning fork arms connected to the tuning fork base, each of the first and second tuning fork arms having a first main surface and a second main surface opposite the first main surface; wherein a plurality of grooves having a first groove and a second groove are formed in each of the first and second main surfaces of each of the first and second tuning fork arms; wherein the first and second grooves are formed in the width direction of the corresponding one of the first and second tuning fork arms; wherein an electrode is disposed in each of the first and second grooves in each of the first and second main surfaces of each of the first and second tuning fork arms so that a series resistance of a fundamental mode of vibration of the quartz crystal tuning fork resonator is less than a series resistance $R_1$ of a second overtone mode of vibration thereof; and further comprising an amplification circuit having a CMOS inverter and a feedback resistor, and a feedback circuit having the quartz crystal tuning fork resonator capable of vibrating in a flexural mode, a plurality of capacitors and a drain resistor; wherein the quartz crystal tuning fork resonator is electrically connected to the CMOS inverter and the feedback resistor of the amplification circuit and to the capacitors and the drain resistor of the feedback circuit to get a quartz crystal oscillating circuit.

21. A quartz crystal unit according to claim 7; wherein the at least one groove formed in at least one of the first and second main surfaces of each of the first and second vibrational arms comprises a groove in each of the first and second main surfaces of each of the first and second vibrational arms; wherein each of the first and second main surfaces of each of the first and second vibrational arms has a central linear portion; and wherein at least one of the grooves in the first and second main surfaces of each of the first and second vibrational arms is formed in the central linear portion so that a distance in the width direction of the at least one groove measured from an outer edge of the at least one groove to an outer edge of the corresponding one of the first and second vibrational arms is less than 0.015 mm.

22. An electronic apparatus comprising: a display portion; and a plurality of oscillators, one of the oscillators being a quartz crystal oscillator comprising a quartz crystal oscillating circuit comprising an amplification circuit having a CMOS inverter and a feedback resistor, and a feedback circuit having a quartz crystal resonator capable of vibrating in a flexural mode, a plurality of capacitors and a drain resistor, the quartz crystal resonator having a base portion and a plurality of vibrational arms connected to the base portion, the quartz crystal resonator being housed in a package comprising a case for housing the quartz crystal resonator and a lid for covering an open end of the case; and wherein the quartz crystal resonator has a cutting angle in the range of ZYlwt (−20to −20°.)/(−25to −25°.)/(−18°. to −18°.) and a piezoelectric constant e12 of the quartz crystal resonator is within a range of 0.1 C/m² to 0.19 C/m² in the absolute value.

23. An electronic apparatus according to claim 22; wherein one of the oscillators is a quartz crystal oscillator comprising an oscillating circuit comprising an amplification circuit having a CMOS inverter and a feedback resistor, and a feedback circuit having a thickness shear mode quartz crystal resonator, a plurality of capacitors and a drain resistor, a pair of electrodes being disposed on a vibrational portion of the thickness shear mode quartz crystal resonator, the thickness shear mode quartz crystal resonator having a cutting angle in the range of ZYlwt(−50°. to −5°.)/±(37°. to 58°.)/(85°. to 95°.) and a piezoelectric constant e'$_{34}$ in the range of 0.055 C/m² to 0.14 C/m² in the absolute value.

24. An electronic apparatus according to claim 22; wherein one of the oscillators is a quartz crystal oscillator comprising an oscillating circuit comprising an amplification circuit having a CMOS inverter and a feedback resistor, and a feedback circuit having a Lame mode quartz crystal resonator, a plurality of capacitors and a drain resistor, a pair of electrodes being disposed on a vibrational portion of the Lame mode quartz crystal resonator, the Lame mode quartz crystal resonator having a cutting angle in the range of ZYlwt(−5°. to +5°.)/±(35°. to 60°.)/±(40°. to 500°.) and a piezoelectric constant e'$_{32}$ in the range of 0.05 C/m² to 0.13 C/m² in the absolute value.

25. An electronic apparatus according to claim 22; wherein the plurality of vibrational arms have a first vibrational arm and a second vibrational arm, each of the first and second vibrational arms having a first main surface and a second main surface opposite the first main surface; wherein at least one groove is formed in at least one of the first and second main surfaces of each of the first and second vibrational arms; and wherein an output signal of the quartz crystal oscillating circuit comprising the quartz crystal resonator having the first and second clock signal for use in operation of the electronic apparatus to display time information at the display portion.

26. An electronic apparatus according to claim 25; wherein a mounting arm protrudes from the base portion; and wherein the mounting arm is mounted on a mounting portion of the case for housing the quartz crystal resonator.

27. An electronic apparatus according to claim 26; wherein a length of the mounting arm is within a range of 0.3 mm to 1.85 mm.

28. An electronic apparatus according to claim 25; wherein the at least one groove formed in at least one of the first and second main surfaces of each of the first and second vibrational arms comprises a plurality of grooves having a first groove and a second groove in at least one of the first and second main surfaces of each of the first and second vibrational arms; wherein the first and second grooves are formed in the width direction of the corresponding one of the first and second vibrational arms; wherein a width of the first groove formed in at least one of the first and second main surfaces of each of the first and second vibrational arms is greater than or equal to a distance in the width direction of the first groove measured from an outer edge of the first groove to an outer edge of the corresponding one of the first and second vibrational arms; and wherein a width of the second groove formed in at least one of the first and second main surfaces of each of the first and second vibrational arms is greater than or equal to a distance in the width direction of the second groove measured from an outer edge of the second groove to an outer edge of the corresponding one of the first and second vibrational arms.

29. An electronic apparatus according to claim 25; wherein the at least one groove formed in at least one of the first and second main surfaces of each of the first and second vibrational arms comprises a plurality of grooves having a first groove and a second groove in at least one of the first and second main surfaces of each of the first and second vibrational arms; wherein the first and second grooves are formed in the width direction of the corresponding one of the first and second vibrational arms; and wherein a width of at least one of the first and second grooves is greater than or equal to a distance in the width direction of the first and second grooves measured from an outer edge of the first groove to an outer edge of the second groove.

30. An electronic apparatus according to claim 25; wherein the quartz crystal resonator has a fundamental mode of vibration and a second overtone mode of vibration capable of vibrating in a flexural mode; wherein the amplification circuit of the quartz crystal oscillating circuit has negative resistances $-RL_1$ and $-RL_2$ for the fundamental mode of vibration and the second overtone mode of vibration of the quartz crystal resonator, an absolute value of the negative resistances being defined by $|-RL_1|$ and $|-RL_2|$; and wherein a ratio of $|-RL_1|$ and $R_1$ is greater than that of $|-RL_2|$ and $R_2$, where $R_1$ and $R_2$ represent a series resistance of the fundamental mode of vibration and the second overtone mode of vibration of the quartz crystal resonator, respectively.

31. An electronic apparatus according to claim 30; wherein the absolute value of the negative resistance $-RL_2$ is less than 105 kΩ.

32. An electronic apparatus according to claim 22; wherein one of the oscillators is a quartz crystal oscillator comprising a quartz crystal oscillating circuit having an amplifier, a quartz crystal unit having a thickness shear mode quartz crystal resonator, a plurality of capacitors and a plurality of resistors, a pair of electrodes being disposed on a vibrational portion of the thickness shear mode quartz crystal resonator; and wherein an output signal of the quartz crystal oscillating circuit having the thickness shear mode quartz crystal resonator is a clock signal for use in operation of the electronic apparatus.

33. An electronic apparatus according to claim 32; wherein the quartz crystal resonator comprises a quartz crystal tuning fork resonator having a tuning fork base and first and section d tuning fork arms connected to the tuning fork base, each of the first and second tuning fork arms having a first main surface and a second main surface opposite the first main surface and opposite side surfaces having a first side surface and a second side surface; wherein a groove having a first stepped portion and a second stepped portion is formed in each of the first and second main surfaces of each of the first and second tuning fork arms so that the groove formed in each of the first and second main surfaces of each of the first and second tuning fork arms is formed in a central linear portion of each of the first and second main surfaces of each of the first and second tuning fork arms and a width of the groove formed in each of the first and second main surfaces of each of the first and second tuning fork arms is greater than or equal to a distance in the width direction of the groove measured from an outer edge of the groove to an outer edge of the corresponding one of the first and second tuning fork arms; wherein a first electrode is disposed on the first stepped portion of the groove formed in each of the first and second main surfaces of each of the first and second tuning fork arms, a second electrode being disposed on the second stepped portion of the groove formed in each of the first and second main surfaces of each of the first and second tuning fork arms, and a third electrode being disposed on each of the first and second side surfaces of each of the first and second tuning fork arms, the first and second electrodes being formed between the third electrodes; wherein the piezoelectric constant e'12 is located between the third electrodes disposed on the first and second side surfaces of each of the first and second tuning fork arms; wherein when the piezoelectric constant e'12 located between the first electrode and the third electrode is defined by a piezoelectric constant and the piezoelectric constant $e'_{12}$ located between the second electrode and the third electrode is defined by a piezoelectric constant $e'_{12o}$, each of the piezoelectric constants $e'_{12i}$ and $e'_{12o}$ is in the range of 0.12 C/m$^2$ to 0.19C/m$^2$ in the absolute value; and wherein a product of $e'_{12i}$ and $e'_{12o}$ is greater than 0.

34. An electronic apparatus according to claim 32; wherein the quartz crystal resonator comprises a quartz crystal tuning fork resonator having a tuning fork base and first and second tuning fork arms connected to the tuning fork base, each of the first and second tuning fork arms having a first main surface and a second main surface opposite the first main surface; wherein at least one groove is formed in each of the first and second main surfaces of each of the first and second tuning fork arms; wherein a length of the tuning fork base is less than 0.5 mm and an overall length of the quartz crystal tuning fork resonator having the tuning fork base and the first and second tuning fork arms connected to the tuning fork base is within a range of 1.02 mm to 1.95 mm; and wherein an electrode is disposed in the at least one groove formed in each of the first and second main surfaces of each of the first and second tuning fork arms so that a capacitance ratio r1 of a fundamental mode of vibration of the quartz crystal tuning fork resonator is less than a capacitance ratio r2 of a second overtone mode of vibration thereof.

35. An electronic apparatus according to claim 32; wherein the quartz crystal resonator comprises a quartz crystal tuning fork resonator having a tuning fork base and first and second tuning fork arms connected to the tuning fork base, each of the first and second tuning fork arms having a first main surface and a second main surface opposite the first main surface; wherein at least one groove is formed in each of the first and second main surfaces of each of the first and second tuning fork arms; wherein an overall length of the quartz crystal tuning fork resonator having the tuning fork base and the first and second tuning fork arms connected to the tuning fork base is within a range of 1.02 mm to 1.95 mm; and wherein an electrode is disposed in the at least one groove formed in each of the first and second main surfaces of each of the first and second tuning fork arms so that a stable factor $S_1$ is less than a stable factor $S_2$, the stable factors $S_1$ and $S_2$ being defined by $r^1/2Q_1^2$ and $r_2/2Q_2^2$, respectively, where Q1 and Q2 represent a quality factor of a fundamental mode of vibration and a second overtone mode of vibration, respectively, of the quartz crystal tuning fork resonator and $r_1$ and $r_2$ represent a capacitance ratio of the fundamental mode of vibration and the second overtone mode of vibration, respectively, of the quartz crystal tuning fork resonator.

36. An electronic apparatus according to claim 32; wherein the quartz crystal resonator comprises a quartz crystal tuning fork resonator, capable of vibrating in a flexural mode and having a quartz crystal tuning fork base, first and second quartz crystal tuning fork arms connected to the quartz crystal tuning fork base and a groove formed in each of opposite main surfaces of each of the first and second quartz crystal tuning fork arms; wherein each of the first and second quartz crystal tuning fork arms has a plurality of different widths having a first width and a second width greater than the first width; and wherein the groove formed in each of the opposite main surfaces of each of the first and second quartz crystal tuning fork arms is formed in at least one of the first and second width directions of the corresponding one of the first and second quartz crystal tuning fork arms.

37. An electronic apparatus according to claim 36; wherein at least one mounting arm is connected to the quartz crystal tuning fork base through a connecting portion; and wherein the at least one mounting arm is mounted on a mounting portion of a case for housing the quartz crystal tuning fork resonator.

38. An electronic apparatus according to claim 36; wherein the groove formed in each of the opposite main surfaces of each of the first and second quartz crystal tuning fork arms is formed in the first width direction of the corresponding one of the first and second quartz crystal tuning fork arms.

39. An electronic apparatus according to claim 32; wherein the quartz crystal resonator comprises a quartz crystal tuning fork resonator having a tuning fork base and first and second tuning fork arms connected to the tuning fork base, each of the first and second tuning fork arms having a first side surface and a second side surface opposite the first side surface; wherein a length of the tuning fork base is within a range of 0.015 mm to 0.49 mm; and wherein an electrode is disposed on each of the first and second side surfaces of each of the first and second tuning fork arms so that the electrode disposed on each of the first and second side surfaces of the first tuning fork arm has an electrical polarity opposite to an electrical polarity of the electrode disposed on each of the first and second side surfaces of the second tuning fork arm and a capacitance ratio $r_1$ of a fundamental mode of vibration of the quartz crystal tuning fork resonator is less than a capacitance ratio $r_2$ of a second overtone mode of vibration thereof.

* * * * *

UNITED STATES PATENT AND TRADEMARK OFFICE
CERTIFICATE OF CORRECTION

PATENT NO. : 7,193,354 B2  
APPLICATION NO. : 10/875114  
DATED : March 20, 2007  
INVENTOR(S) : Hirofumi Kawashima Page 1 of 1

It is certified that error appears in the above-identified patent and that said Letters Patent is hereby corrected as shown below:

Column 23, Claim 2, lines 53-54, cancel "wherein the resonator according to claim 1;".

Column 23, Claim 3, line 62, insert --and-- after "first";
Column 24, Claim 3, line 3, "r1" should read --$r_1$--.

Column 24, Claim 6, lines 46-47, "(-20°. to 20°.)/(-25°. to 25°.)/(-18°. to -18°.)" should read --(-20° to +20°)/(-25° to +25°)/(-18° to +18°)--.

Column 27, Claim 20, line 24, insert --$R_1$-- after "resistance";
line 26, "$R_1$" should read --$R_2$--.

Column 27, Claim 22, lines 64-65, "(-20to -20°.)/(-25to -25°.)/(-18°. to -18°.)" should read -- (-20° to +20°)/(-25° to +25°)/(-18° to +18°)--;
line 65, "e12" should read --$e'_{12}$--.

Column 28, Claim 23, lines 10-11, "(-50°. to -5°.)/±(37°. to 58°.) (85°. to 95°.)" should read --(-5° to +5°)/±(37° to 58°)/(85° to 95°)--.

Column 28, Claim 24, line 22, "(-5°. to +5°.)/±(35°. to 60°.) /± (40° to 500°.)" should read --(-5° to +5°)/±(35° to 60°)/±(40° to 50°)--.

Column 28, Claim 25, line 34, insert --vibrational arms capable of vibrating in a flexural mode is a-- after "second".

Column 30, Claim 33, lines 3 and 6, "e'12" should read --$e'_{12}$--;
line 7, insert --$e'_{12i}$-- after "constant".

Signed and Sealed this

Sixteenth Day of February, 2010

David J. Kappos  
*Director of the United States Patent and Trademark Office*